(12) United States Patent
Dinneen et al.

(10) Patent No.: US 10,711,364 B2
(45) Date of Patent: *Jul. 14, 2020

(54) UNIFORM FLOW BEHAVIOR IN AN ELECTROPLATING CELL

(71) Applicant: Lam Research Corporation, Fremont, CA (US)

(72) Inventors: Daniel Mark Dinneen, Tigard, OR (US); Jingbin Feng, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 295 days.

This patent is subject to a terminal disclaimer.

(21) Appl. No.: 15/923,873

(22) Filed: Mar. 16, 2018

(65) Prior Publication Data
US 2018/0202062 A1 Jul. 19, 2018

Related U.S. Application Data

(63) Continuation of application No. 14/073,022, filed on Nov. 6, 2013, now Pat. No. 9,945,044.

(51) Int. Cl.
*C25D 17/00* (2006.01)
*H01L 21/67* (2006.01)
(Continued)

(52) U.S. Cl.
CPC ............ *C25D 17/001* (2013.01); *C25D 5/08* (2013.01); *C25D 7/123* (2013.01); *C25D 17/002* (2013.01); *C25D 17/06* (2013.01); *C25D 21/10* (2013.01); *C25D 21/12* (2013.01); *H01L 21/67* (2013.01); *H01L 21/6723* (2013.01)

(58) Field of Classification Search
None
See application file for complete search history.

(56) References Cited

U.S. PATENT DOCUMENTS

| 4,466,864 A | 8/1984 | Bacon et al. |
| 5,865,976 A | 2/1999 | Takeuchi et al. |

(Continued)

FOREIGN PATENT DOCUMENTS

| JP | 2003-221698 | 8/2003 |
| WO | WO 00/38218 | 6/2000 |

OTHER PUBLICATIONS

Taiwan First Office Action and Search Report dated Jul. 2, 2018 issued in Application No. TW 103138434.
(Continued)

*Primary Examiner* — Harry D Wilkins, III
(74) *Attorney, Agent, or Firm* — Weaver Austin Villeneuve & Sampson LLP

(57) ABSTRACT

Apparatuses and methods are provided for depositing a metal layer on a wafer. A secondary weir is positioned at a region below the primary weir such that overflowed plating solution over the primary weir during electroplating flows in a substantially azimuthally uniform manner. Methods are provided for electroplating wafers by increasing flow rate between wafer processes while plating solution flows over a primary weir, remains in contact with the overflowing plating solution, and flows onto the secondary weir such that overflow is substantially azimuthally uniform.

22 Claims, 20 Drawing Sheets

(51) Int. Cl.
  *C25D 7/12* (2006.01)
  *C25D 5/08* (2006.01)
  *C25D 17/06* (2006.01)
  *C25D 21/10* (2006.01)
  *C25D 21/12* (2006.01)

(56) References Cited

U.S. PATENT DOCUMENTS

| | | | |
|---|---|---|---|
| 5,883,762 A | 3/1999 | Calhoun et al. | |
| 5,985,126 A | 11/1999 | Bleck et al. | |
| 6,080,291 A * | 6/2000 | Woodruff | C25D 17/001 204/212 |
| 6,093,291 A | 7/2000 | Izumi et al. | |
| 6,136,163 A | 10/2000 | Cheung et al. | |
| 6,254,760 B1 | 7/2001 | Shen et al. | |
| 6,270,647 B1 | 8/2001 | Graham et al. | |
| 6,585,876 B2 * | 7/2003 | Dordi | C25D 17/008 204/224 R |
| 6,713,122 B1 | 3/2004 | Mayer et al. | |
| 6,726,826 B2 | 4/2004 | Johnson et al. | |
| 6,913,680 B1 | 7/2005 | Zheng et al. | |
| 7,273,535 B2 * | 9/2007 | Kovarsky | B01D 61/44 204/252 |
| 8,262,871 B1 | 9/2012 | Mayer et al. | |
| 9,945,044 B2 | 4/2018 | Dinneen et al. | |
| 2001/0000396 A1 | 4/2001 | Dordi et al. | |
| 2001/0032788 A1 | 10/2001 | Woodruff et al. | |
| 2002/0008037 A1 | 1/2002 | Wilson et al. | |
| 2003/0089608 A1 | 5/2003 | Kumekawa | |
| 2004/0234696 A1 | 11/2004 | Hongo et al. | |
| 2011/0315547 A1 | 12/2011 | Suemoto | |
| 2012/0308346 A1 | 12/2012 | Keigler et al. | |

OTHER PUBLICATIONS

Singapore Search Report and Written Opinion dated Jul. 13, 2018 issued in Application No. SG 10201803755P.

U.S. Office Action dated Mar. 21, 2016 issued in U.S. Appl. No. 14/073,022.

U.S.Final Office Action dated Sep. 14, 2016 issued in U.S. Appl. No. 14/073,022.

U.S. Office Action dated Apr. 4, 2017 issued in U.S. Appl. No. 14/073,022.

U.S. Notice of Allowance dated Dec. 8, 2017 issued in U.S. Appl. No. 14/073,022.

* cited by examiner 1A-1

1A-2

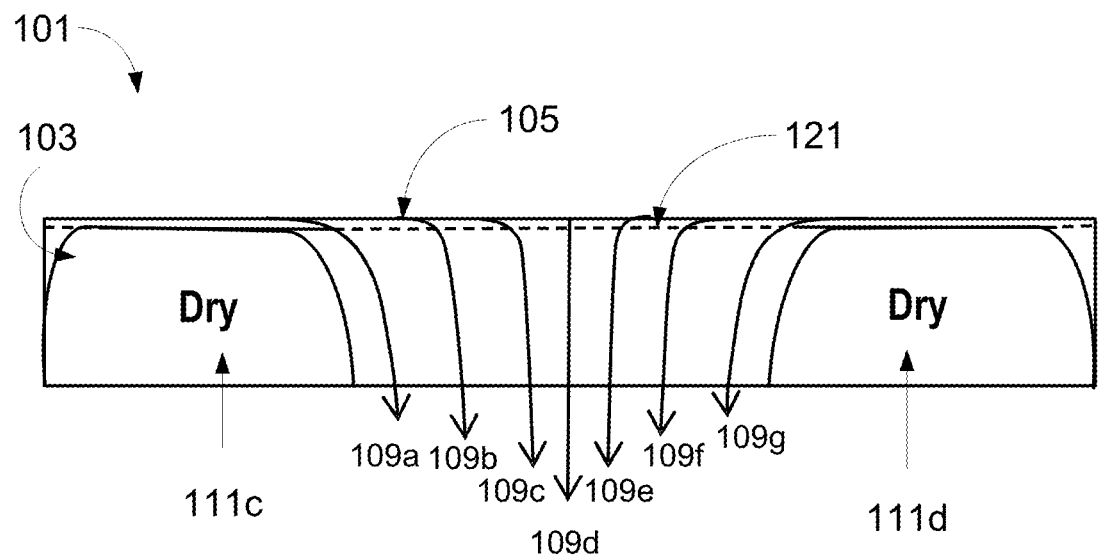
FIG. 1B-1
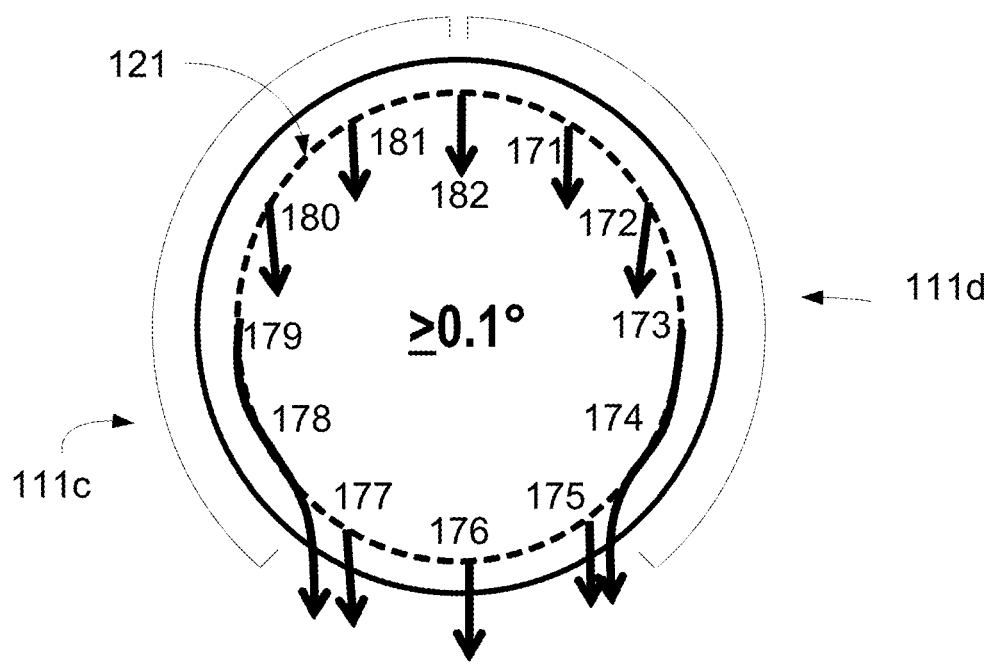
FIG. 1B-2
FIG. 1B 3A-1

3A-2

3B-1

3B-2

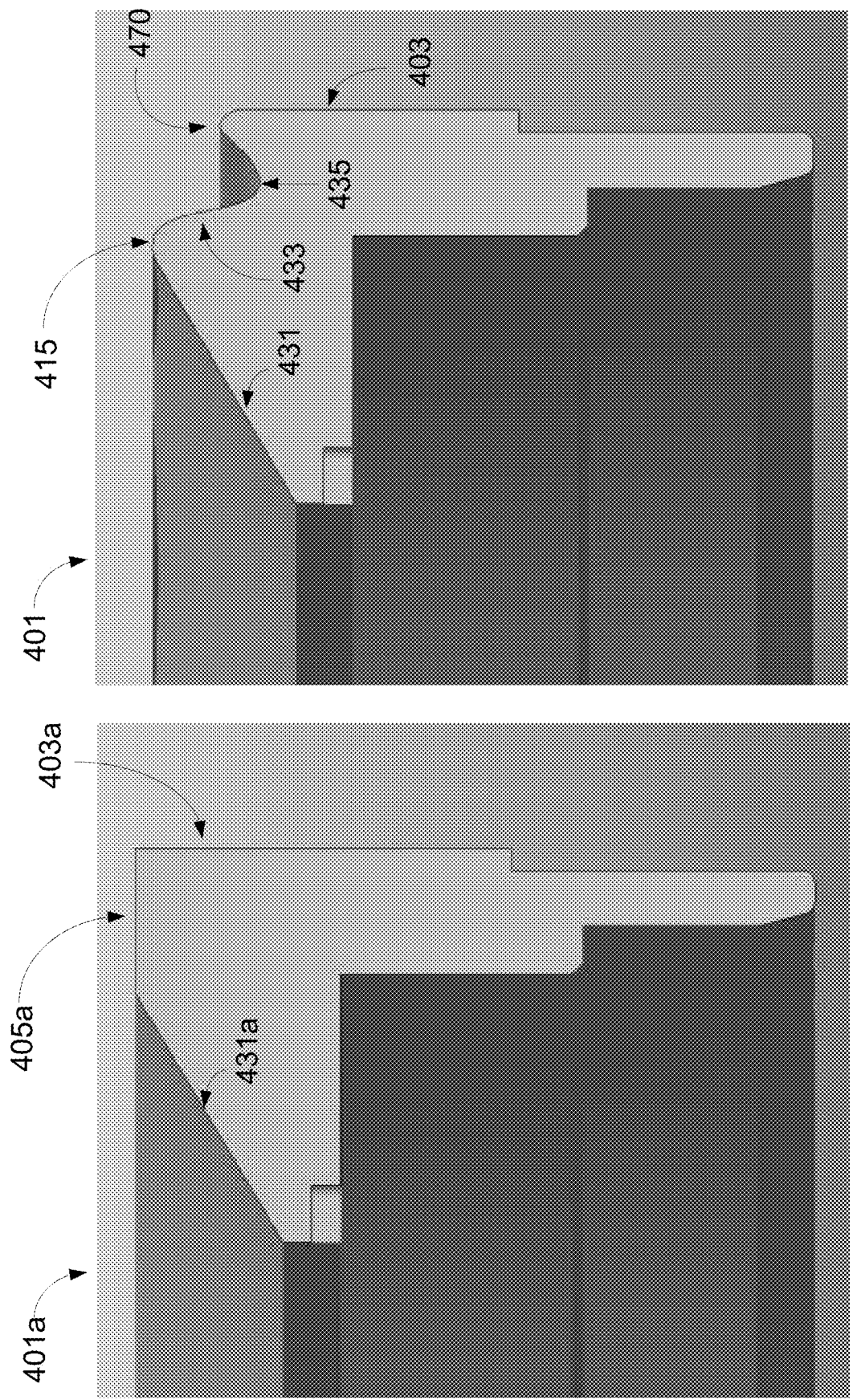

UNIFORM FLOW BEHAVIOR IN AN ELECTROPLATING CELL

CROSS-REFERENCE TO RELATED APPLICATION

This application is a continuation and claims benefit of U.S. patent application Ser. No. 14/073,022, filed Nov. 6, 2013, and titled "METHOD FOR UNIFORM FLOW BEHAVIOR IN AN ELECTROPLATING CELL," which is incorporated by reference herein in its entirety and for all purposes.

BACKGROUND

Depositing a metal layer onto a wafer, also known as "electroplating" or "electrodeposition," is often a critical step in manufacturing an integrated circuit or semiconductor device. Substrates that undergo electroplating processes include 300 mm wafers and 450 mm wafers. Copper is often plated onto semiconductor wafers for device wiring in integrated circuits.

Electroplating cells are used in electroplating processes to provide a plating solution where metal electrolytes deposit onto the wafer. An electroplating cell may have several components, including a chamber with walls, a wafer support, an anode region, a plating solution region, a membrane separating such regions, various inlets, and an plating solution collecting region where overflowed plating solution is collected to be filtered, recirculated, and reintroduced into the plating solution.

In modern wafer electroplating processing, the quality of the deposited metal layer on the wafer is a major concern. In electroplating processes, a uniform, defect-free wafer is desired, since defects on the deposited metal film such as pits, protrusions, or particles reduce wafer performance and frequently yield.

SUMMARY

Apparatuses and methods for depositing metal on a wafer are described herein. Apparatuses involve a plating cell for electroplating a substantially defect-free and uniform layer of a metal onto a wafer including a wafer holder configured to hold the semiconductor wafer during electroplating and immerse the wafer in plating solution, an inlet for receiving the plating solution flowing through the plating cell during electroplating, an outlet for removing the flowing electrolyte during electroplating, and a chamber wall. The chamber wall includes a primary weir on the top surface of the chamber wall over which the plating solution overflows before exiting the outlet during electroplating and a secondary weir positioned at a region below the primary weir where the overflowed plating solution can pool and remain in contact with the plating solution overflowing the primary weir, whereby the plating solution flows over the primary weir in a substantially azimuthally uniform manner.

In various embodiments, the plating cell also includes a region for supporting anode during electroplating. According to some embodiments, the plating cell also includes a cathode region, wherein the region for supporting anode is a separated anode chamber. In some embodiments, the cathode region and separated anode chamber are separated by a membrane. According to some embodiments, the secondary weir and primary weir are each part of a monolithic structure.

In some implementations, the secondary weir and primary weir are not part of the same monolithic structure. In various embodiments of this implementation, the secondary weir includes elastomer.

In various embodiments, the secondary weir is positioned at a point less than 10 millimeters from the primary weir, where position is measured by the distance between the top of the primary weir and the top of the secondary weir. In some embodiments, the secondary weir is positioned between about 1 and about 4 millimeters from the primary weir.

According to some embodiments, the secondary weir defines a moat measuring between about 1 millimeter and about 2 millimeters from top to bottom. In various embodiments, the moat is partially defined by the chamber wall. A first slope connects the primary weir to the moat and a second slope connects the moat to the secondary weir in various embodiments. The base of the moat may be horizontal in shape or curved in shape.

The plating cell may also include a controller configured to control plating solution flow rate in the electroplating cell such that the flow rate is increased between electroplating the wafer and electroplating a subsequent wafer. In some embodiments, the plating cell may be configured to accommodate an electrolyte volumetric flow rate of between about 2 and about 30 liters during electroplating.

Methods involve electroplating a layer of metal on wafers in an electroplating cell including flowing plating solution to a plating cell at a first flow rate while electroplating a first semiconductor wafer with the plating solution, removing the first wafer from the plating solution, increasing plating solution flow to a second flow rate after electroplating the first semiconductor wafer, decreasing the flow rate of the plating solution to about the first flow rate, and electroplating a second semiconductor wafer while contacting the second semiconductor wafer with the flowing plating solution. Plating solution flows over a primary weir to a secondary weir positioned at a region below the primary weir where the overflowed plating solution pools and remains in contact with the plating solution overflowing the primary weir whereby overflow of the plating solution over the primary weir is substantially azimuthally uniform.

According to some embodiments, the method further includes tilting the wafer towards an entry point on the wafer and tilting the electroplating cell at an angle less than about 0.15° towards the entry point on the wafer prior to flowing plating solution.

According to various embodiments, the first flow rate is between about 2 L/min and about 20 L/min. In various embodiments, the plating solution is flowed at the second flow rate for about 20 seconds. As an example, the second volumetric flow rate may be about 1.2 to about 5 times faster than the first volumetric flow rate. In some embodiments, the plating solution at a point 150 millimeters from the center of a top surface of the plating solution flows over the primary weir in less than about 5 seconds while the plating solution flows at the second flow rate. Stated another way, the plating solution may flow radially over a distance of about 50 mm in less than about 5 seconds.

The secondary weir and primary weir are each part of a monolithic structure. In some embodiments, the secondary weir is positioned at a point less than 10 millimeters from the primary weir where position is measured between the top of the primary weir and the top of the secondary weir. In some embodiments, the secondary weir is positioned at a point between about 1 and about 4 millimeters from the primary weir.

In various embodiments, the secondary weir and primary weir are not part of the same monolithic structure. In some of these embodiments, the secondary weir includes elastomer.

According to various embodiments, the secondary weir defines a moat measuring between about 1 millimeter and about 3 millimeters from top to bottom. In some of these embodiments the moat is partially defined by a chamber wall.

These and other aspects are described further below with reference to the drawings.

BRIEF DESCRIPTION OF THE DRAWINGS

FIG. 1B depicts schematic illustrations of a side-view of weir wall wetting and a top view of fluid overflow behavior of a tilted electroplating cell.

FIG. 4A are schematic illustrations comparing a weir wall in accordance with disclosed embodiments.

DETAILED DESCRIPTION

Figure 1A:
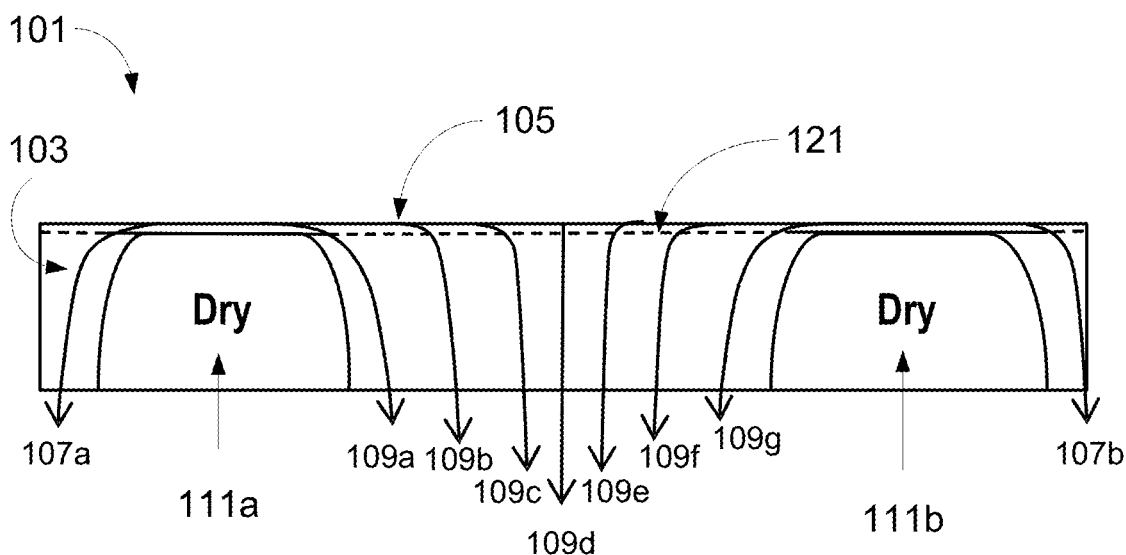
FIG. 1A depicts schematic illustrations of a side-view of weir wall wetting and a top view of fluid overflow behavior of a level electroplating cell.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Fabrication of integrated circuits often involves electroplating a wafer or substrate in an electroplating cell. Electroplating, also known as "electrodeposition" may involve depositing a metal layer onto a wafer. An electroplating cell may have several components including a wafer support, an anode region, a plating solution region, a membrane separating such regions, an anode frame securing the membrane, various inlets for flowing plating solution or anode electrolyte solution, a chamber wall over which plating solution in a plating bath overflows, and an overflowed plating solution collecting region surrounded by an outer wall. For purposes of this disclosure, a plating solution region may also be referred to as a "cathode chamber" while plating solution refers to the fluid within the plating solution region and is sometimes called a "plating bath." In contrast, a "plating bath reservoir" refers to a reservoir where plating solution is stored to be filtered and circulated to the plating solution region.

Generally, electrodeposition of a metal, such as copper, onto a wafer occurs by positioning an anode and the wafer (the cathode) in a chamber filled with a plating bath of electrolyte plating solution, and applying a current such that metal ions in the solution plate onto the wafer. During electroplating, plating solution is continuously flowed into the plating bath while plating solution flows over the top surface of the chamber wall, also referred to as a "weir," and drops into a collecting region. Collected overflowed plating solution is then returned to the plating solution reservoir, filtered, and re-circulated to flow back into the plating bath.

Many electroplating cells have chamber walls such that the inner surface of the chamber wall and the top surface of the chamber wall join at about a 90° angle, or the outer surface of the chamber wall and the top surface of the chamber wall join at about a 90° angle, or both. Some electroplating cells also have chamber walls where the top surface has a horizontal component that joins the outer surface at about 90° and an inner slanted component angled downwards from the horizontal component towards the center of the chamber that meets the inner wall at an angle greater than 90°.

One goal of electroplating is depositing substantially uniform metal layers on wafers. Uniform overflow of plating solution out of the plating bath may promote uniform deposition. Further, uniform overflow may facilitate rapid removal of defect-causing components from the plating bath. In an electroplating cell where uniform overflow is observed, defect-causing particles, bubbles, and other debris may exit the plating bath by flowing radially in substantially azimuthally uniform directions to flow over the weir of the chamber wall and enter the collecting region. Good results are achieved when 360 degree radial flow occurs at reasonably high speeds (e.g., about 5 seconds or less to flow from an interior location on the plating bath surface to the weir).

Current methods for yielding uniform overflow include tilting the electroplating cell. Points on a wafer are often designated according to points on a clock such that there is a 1 o'clock position, a 2 o'clock position, a 3 o'clock position, a 4 o'clock position, a 5 o'clock position, a 6 o'clock position, a 7 o'clock position, a 8 o'clock position, a 9 o'clock position, a 10 o'clock position, a 11 o'clock position, and a 12 o'clock position. Corresponding points from a top-view of the electroplating chamber filled with plating solution may also follow the same convention such that the 1 o'clock position on a wafer corresponds with the 1 o'clock position on the circumference of the chamber, the 2 o'clock position on a wafer corresponds with the 2 o'clock position on the circumference of the chamber, etc. For purposes of this disclosure, entry of a tilted wafer is at the 6 o'clock position such that the wafer is tilted downwards at the 6 o'clock position and first enters the plating bath at the 6 o'clock position.

Tilting the wafer such that the entry point of the wafer is dipped first into the electrolyte plating bath is believed to reduce or eliminate bubbles trapped under the wafer as it is lowered into the plating solution. Tilting the electroplating cell towards the entry point such that plating solution in the part of the plating bath where the wafer first enters into the electrolyte plating bath increases the flow velocity in this region, and is believed to reduce or eliminate particles or bubbles in the plating solution by quickly flushing out such particles or bubbles when lowering the wafer into the plating solution.

Leveling is another method used to minimize wafer defects and yield uniform overflow such that the electroplating cell is substantially perpendicular to the direction of gravity to permit fluid to flow over the edges of the chamber wall uniformly. An electroplating cell is monitored and evaluated before adjustments are made to level the cell. Various other practices or any combination of these practices may have been used to yield more uniform electrodeposition on wafers.

To evaluate whether plating solution is overflowing uniformly, various methods may be employed. One method of evaluating quality of overflow performance is the bubble clearance test. In one implementation of the bubble clearance test, a bubble is placed at a point on the surface of the plating solution and the trajectory taken by the bubble on the surface is monitored while the time it takes for the bubble to exit the cell over the weir wall is recorded. Bubbles may be placed at various positions near the top surface of the chamber wall, such as at a point on the surface of the plating bath at the 6 o'clock position, or the 12 o'clock position. The bubble clearance test may involve placing bubbles at each point (1 o'clock position, 2 o'clock position, etc.) on the surface of the plating bath about 150 millimeters from the center of the surface of the plating bath. Each bubble's flow path is governed by the local behavior of the fluid at that point and observations may be made to evaluate the path of the traveling bubble and the time it takes for a bubble to clear the chamber. In many cases, it is desired that bubbles follow a radial trajectory to the chamber wall within a predefined time such that overflow may be substantially azimuthally uniform. For example only, a bubble dispensed at a point 150 mm from the center of the surface of the plating solution in the plating chamber at the 3 o'clock position should overflow the weir at the 3 o'clock position in less than about 5 seconds from time of dispense. The desired time it takes for a bubble to exit may vary by plating solution or from electroplating cell to electroplating cell. In some plating cells for plating copper on a wafer, the desired time for a bubble to clear the chamber may be between about 3 and about 5 seconds. The results of the bubble test may then be used to determine whether if the plating cell or components of the plating cell may need adjustments, such as fine tune leveling, to meet the trajectory and timing specifications of bubble clearance for low defect plating.

One concern is that leveling to reproduce fluid behavioral patterns on electroplating cells containing the same hardware may be difficult or even impossible. The above-mentioned tilting method prior to wafer lowering has been implemented to attempt to obtain more preferential bubble clearance times in the area where the wafer first enters the plating solution. However, since every electroplating cell may exhibit differences in overflow paths, leveling must be done to each cell for each deposition. Even if the apparatus is set up in a similar manner, bubble clearance performance may not be replicable, which may suggest that there may be another effect other than leveling that is causing non-reproducible bubble clearance performance. Even in level electroplating cells, fluid overflow may not necessarily be uniform. While some bubbles at some positions may follow a radial trajectory and overflow the weir in acceptable times, others may not follow a radial trajectory or may fail to meet the time specification, or both, demonstrating unsatisfactory fluid flow performance.

Close analysis of how fluid overflows the weir of a standard electroplating cell showed unexpected results in fluid behavior. It is expected in level electroplating cells that plating solution would flow radially from the center of the chamber using the shortest distance to reach the edge of the chamber. However, the presence of "wet" and "dry" regions was observed resulting in a weir wall wetting phenomenon such that fluid flow performance was irregular. In some cases, the bubble may simply move in a non-radial direction toward a "wet" area of the chamber wall and join a streamline to exit in that area. Some bubbles that may be sufficiently separated from weir regions associated with a "wet" outer region of the chamber wall may move in circles, move extremely slowly in a local region and/or never reach a weir to exit the chamber.

Figure 1A:
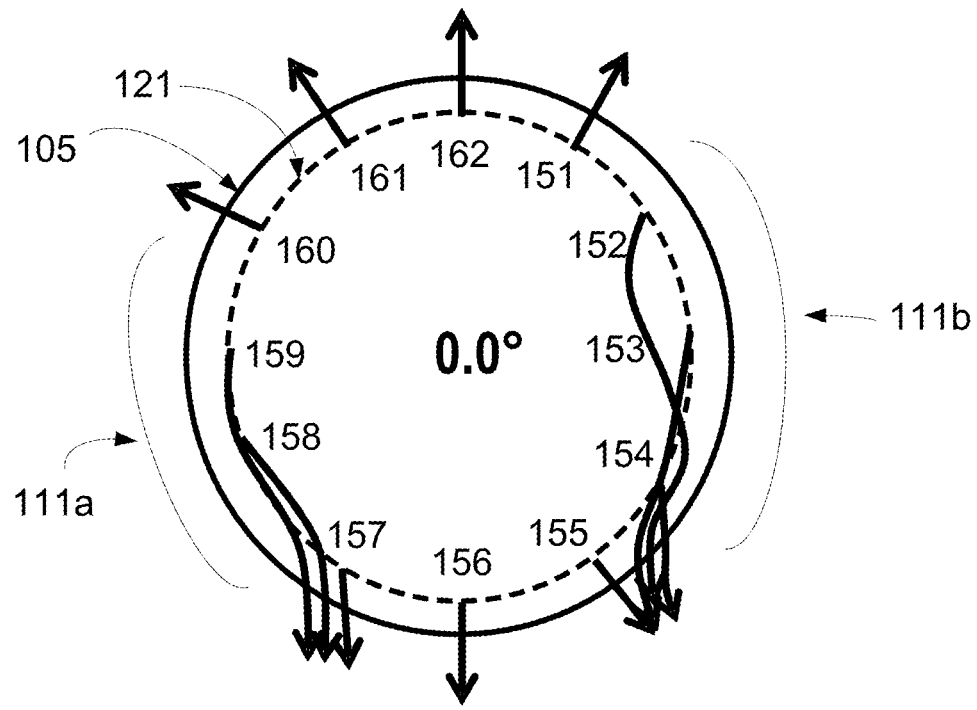

FIG. 1A depicts two views of a chamber within a level electroplating cell. FIG. 1A-1 is a side-view of outer wall region 103 near top surface or weir 105 of chamber wall 101. Chamber wall 101 is viewed from one azimuthal position such that the center of chamber wall 101 may be curved towards the viewer while the left and right edges of chamber wall 101 are curved away from the viewer. Plating solution reaching weir 105 of chamber wall 101 may move until it is caught in a streamline in one of paths 107a, 107b, 109a, 109b, 109c, 109d, 109e, 109f, or 109g which draws the solution over chamber wall 101 down outside region 103. As shown, in standard electroplating cells, plating solution overflows chamber wall 101 preferentially down paths 107a, 107b, 109a, 109b, 109c, 109d, 109e, 109f, and 109g and not at all in regions 111a and 111b. Such exit path overflow behavior may result in "dry" regions 111a and 111b with locations of such regions not repeatable from cell to cell. "Dry" regions such as regions 111a and 111b as well as "wet" regions may alternate throughout the entire outer region 103 near weir 105 of chamber wall 101 around the entire chamber.

FIG. 1A-2 shows another view of this phenomenon. FIG. 1A-2 is a top-view of a level standard electroplating cell with a chamber filled with plating solution. Plating solution located on the bath surface along circumferential path 121 at each of the 1 o'clock, 2 o'clock, etc. positions 150 millimeters from the center of the surface of the plating solution may travel various paths to exit the chamber. For instance, plating solution located at the 10 o'clock, 11 o'clock, 12 o'clock, and 1 o'clock positions may exhibit radial overflow in paths 160, 161, 162, and 151 respectively out of the chamber over weir 105. Plating solution located at the 5 o'clock and 6 o'clock positions also exhibit radial overflow in paths 155 and 156, respectively, out of the chamber over the weir 105. However, plating solution located at the 7 o'clock, 8 o'clock and 9 o'clock positions travels in random paths 157, 158, 159, respectively, until it is caught in the streamline of path 156, thus resulting in a "dry" region 111a. Plating solution located at the 2 o'clock, 3 o'clock and 4 o'clock positions also travels randomly in paths 152, 153, and 154 respectively until it is caught in the streamline of path 155, thus resulting in another "dry" region 111b. FIGS. 1A-1 and 1A-2 illustrate one example of weir overflow non-uniformity resulting in wet and dry regions. Other non-uniform distributions are commonly encountered. The flow paths were observed by placing bubbles along circumferential path 121 and observing their behavior.

A more challenging issue may arise where electroplating cells are tilted during electroplating processes and a similar phenomenon is observed in these tilted standard cells. FIG. 1B depicts two views of parts of a chamber within a tilted electroplating cell. FIG. 1B-1 is a side-view of outer wall region 103 near top surface weir 105 of chamber wall 101. The chamber is tilted towards the viewer such that the chamber tilts forward towards the viewer at the center point of the chamber wall 101. The chamber wall 101 is viewed from one azimuthal position such that the center of chamber wall 101 may be curved towards the viewer while the left and right edges of chamber wall 101 are curved away from the viewer. Plating solution reaching weir 105 of the chamber wall 101 may be redirected until it is caught in a streamline in paths 109a, 109b, 109c, 109d, 109e, 109f, and 109g. Note that as compared to FIG. 1A, since the chamber is tilted, plating solution at the left edge and right edge of the depicted figure may follow one of paths 109a, 109b, 109c, 109d, 109e, 109f, and 109g. Such overflow behavior results in dry regions 111c and 111d because plating solution preferentially overflows down one of paths 109a, 109b, 109c, 109d, 109e, 109f, and 109g.

FIG. 1B-2 shows another view of this phenomenon in a tilted chamber. FIG. 1B-2 depicts an electroplating cell tilted more than 0.1° towards the 6 o'clock position, the threshold point at which bubbles (or any surface feature on the plating bath) along circumferential path 121 at any position 150 millimeters from the center of the surface of the plating solution may be pulled primarily by gravity towards the 6 o'clock position. This presents a particularly unique problem because bubbles placed at the 10 o'clock, 11 o'clock, 12 o'clock, 1 o'clock and 2 o'clock positions travel down paths 180, 181, 182, 171, and 172 respectively for a longer period of time for a longer distance through the center of the plating solution where a wafer is being electroplated before clearing the chamber.

The profile of the standard chamber wall edge and hydrophobic nature of the material of the chamber wall may promote this uneven fluid behavior on the outside region 103 of the chamber wall 101. Thus, current electroplating processes struggle to exhibit uniform overflow behavior to decrease defects in the deposited wafer.

Provided herein are apparatuses and methods for yielding substantially defect-free and uniform electroplated wafers. Generally, the disclosed embodiments involve a secondary weir positioned at a region below a primary weir where plating solution overflows from the plating cell over the primary weir, onto a region between the primary weir and secondary weir and over the secondary weir to a collecting region outside of the chamber. Uniform overflow behavior is observed.

Apparatus

Various apparatuses disclosed herein involve electroplating cells including a secondary weir positioned at a region below the primary weir or top surface of the chamber wall such that overflowing plating solution first flows over the primary weir, pools at a region between the primary weir and the secondary weir adjacent to the outer region of the chamber wall, then flows over the secondary weir into a collecting region outside of the chamber. Use of a secondary weir substantially improves overflow uniformity over the chamber wall for level and tilted electroplating cells.

Figure 2A:
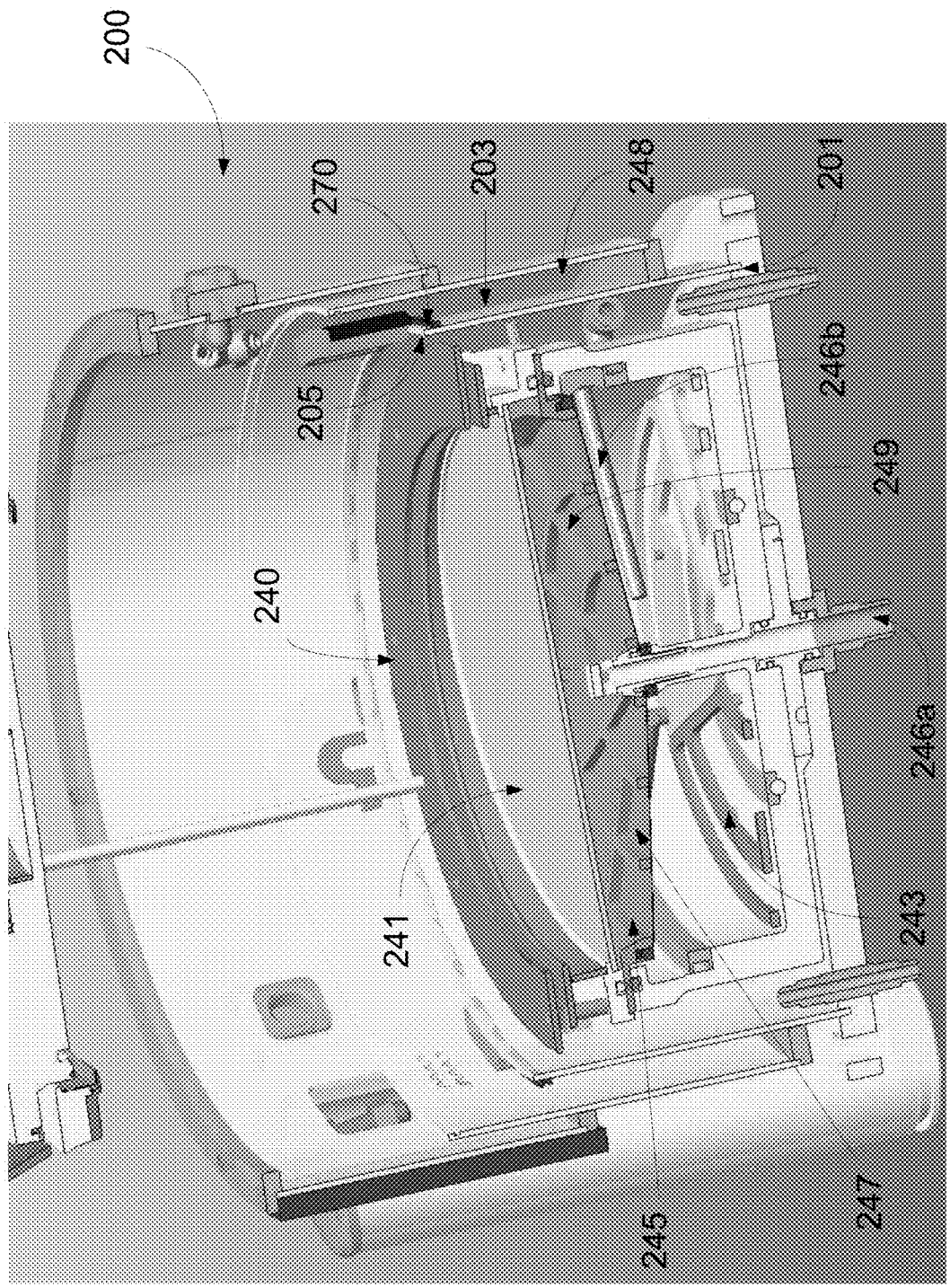
FIG. 2A is an angled side-view cross-section of an electroplating cell in accordance with disclosed embodiments.

A secondary weir may be implemented in various types of electroplating cells. FIG. 2A depicts one example of an angled side-view cross-section of an electroplating cell 200 with a secondary weir 270 on an outer region 203 of a chamber wall 201 below a primary weir 205. The electroplating cell 200 may have several components including one or more electric field shaping inserts 240, a diffuser plate 241 for promoting uniform flow upwards toward the wafer surface, an anode region or anode chamber 243, a cathode chamber or plating bath region 245, a membrane 247 separating such regions, an anode chamber frame 249 holding the membrane 247, various inlets 246a and 246b for flowing plating solution or anode electrolyte solution (anolyte), respectively, a chamber wall 201 over which plating solution in plating bath region 245 overflows, and an overflowed plating solution collecting region 248. In certain embodiments, the diffuser plate 241 is a flow shaping element having a series of parallel, non-communicating holes such as described in U.S. patent application Ser. No. 12/291,356, filed Nov. 7, 2008, and incorporated herein by reference in its entirety. While the FIG. 2A shows many features of an electroplating cell, only a few of them are directly pertinent to the disclosed weir design. Thus, for example, an electroplating cell having the weir wall design disclosed herein need not include some of the features shown in FIG. 2A such as field shaping inserts, a diffuser plate, a separated anode chamber (with associated membrane and frame), etc.

Figure 2B:
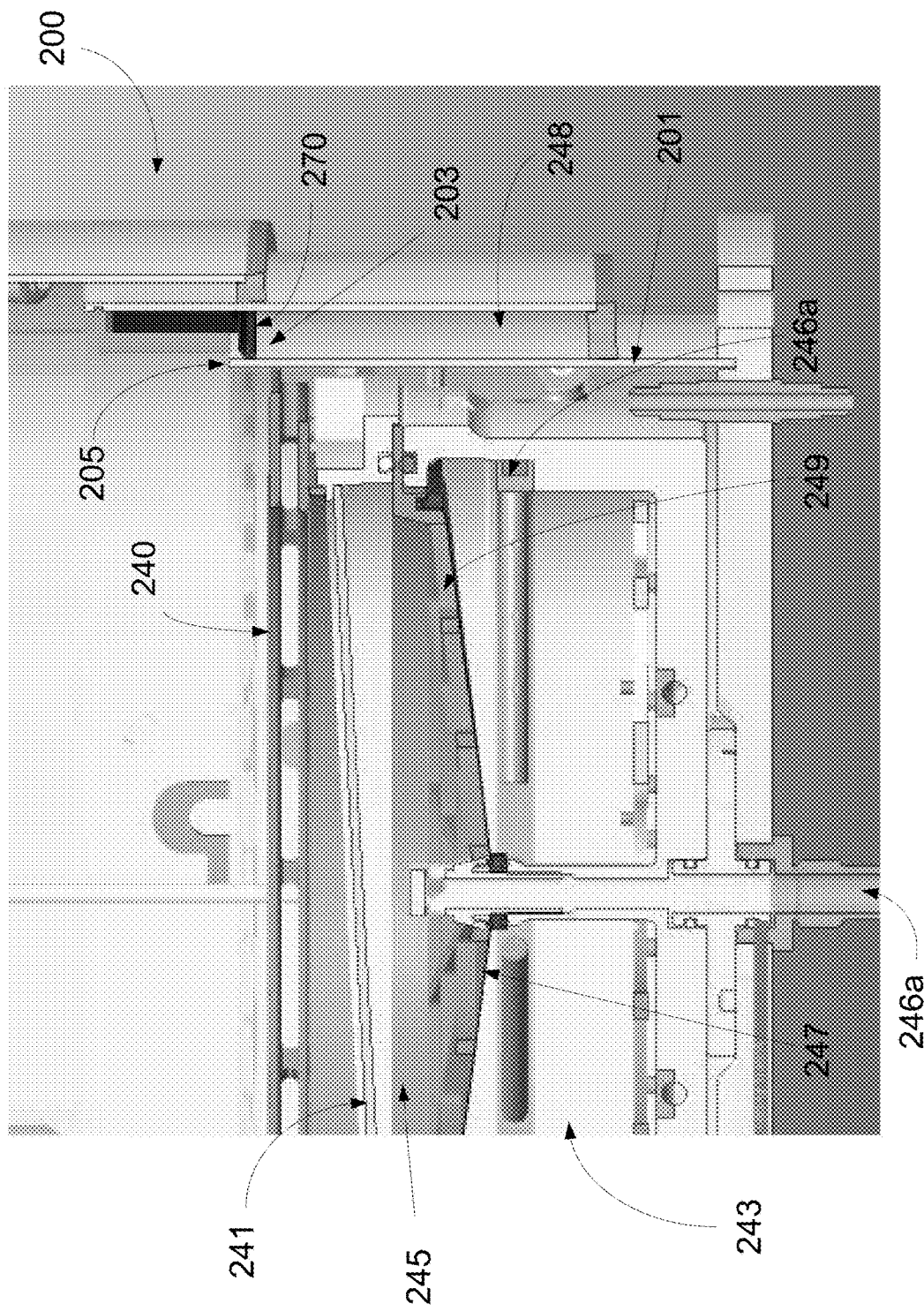
FIG. 2B is a side-view cross-section of a section of an electroplating cell in accordance with disclosed embodiments.

FIG. 2B depicts a closer view of the side-view cross-section of the electroplating cell 200 in FIG. 2A. As with the illustration in FIG. 2A, the electroplating cell 200 includes field shaping rings 240, a diffuser plate 241, an anode chamber 243, a plating bath region 245, a membrane 247 separating the anode chamber from plating bath region 245, an anode frame 249 above the membrane 247, and inlets 246a and 246b for flowing plating solution and anode electrolyte solution respectively. Here, the secondary weir 270 is implemented at the edge of chamber wall 201 just below the primary weir 205. Plating solution may overflow from chamber 200 and over secondary weir 270 into the collecting region 248.

Figure 3A:
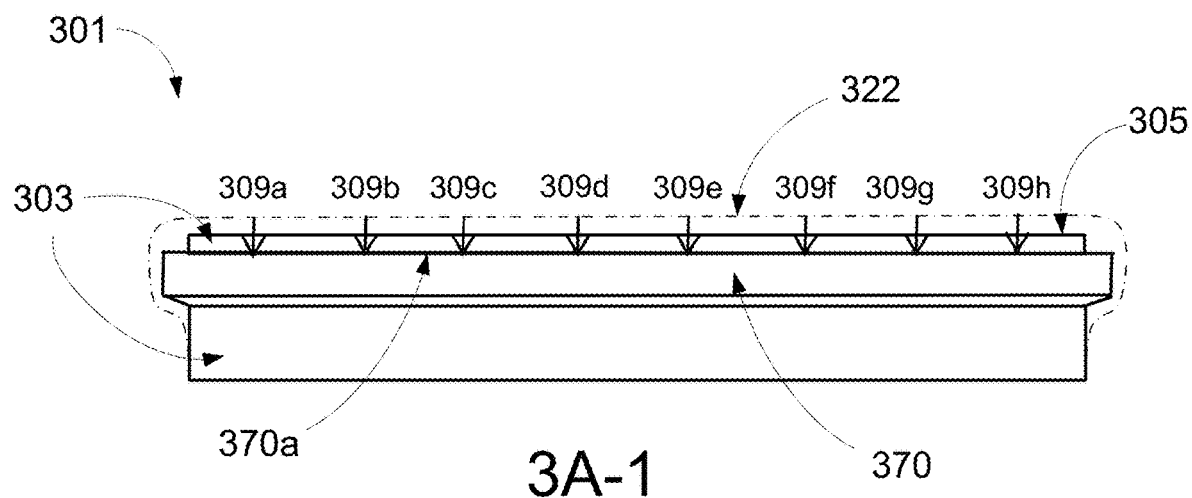
FIG. 3A depicts schematic illustrations of a side-view of weir wall wetting and a top view of fluid overflow behavior of a level electroplating cell in accordance with disclosed embodiments.
Figure 3A:
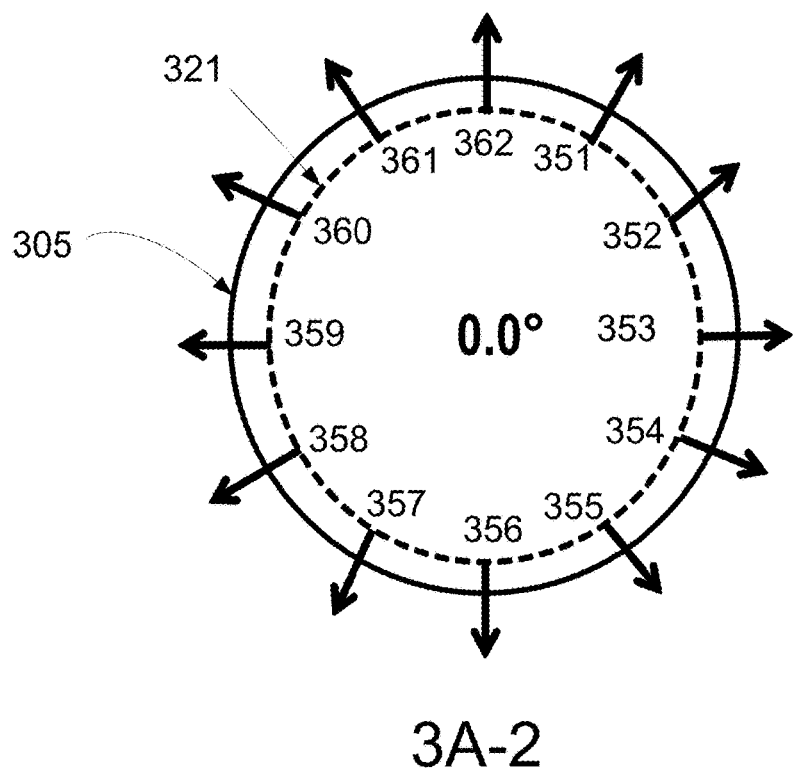

In various embodiments, a secondary weir retains a circumferential ring of plating solution close to the apex of the primary weir. This ensures that the initial vertical drop immediately over the apex of the primary weir remains continuously wet along the section of outer region of the chamber wall near the primary weir, thus ensuring fluid exiting the top of the plating cell will do so with a radial trajectory. FIG. 3A depicts two views of plating solution fluid behavior on a level electroplating cell with a secondary weir. FIG. 3A-1 is a side-view of outer region 303 near primary weir 305 of chamber wall 301 with an implemented secondary weir 370. Plating solution 322 flows over primary weir 305 of chamber wall 301 onto a surface region 370a of the secondary weir 370 where it pools before flowing over secondary weir 370 and down onto or past outer region 303. As shown, plating solution uniformly flows out of the chamber along paths 309a, 309b, 309c, 309d, 309e, 309f, 309g, and 309h. As compared to FIG. 1A-1, there are no "dry" regions at the top of the outer region 303 and paths 309 are uniformly distributed along the primary weir 305.

FIG. 3A-2 is a top view of plating solution fluid flow behavior in a level electroplating cell with a secondary weir. Like FIG. 1A-1, plating solution elements located around the edge of a wafer (as sometimes examined by bubbles placed 150 millimeters from the center of the surface of the plating solution at each of 1 o'clock, 2 o'clock, 3 o'clock, 4 o'clock, 5 o'clock, 6 o'clock, 7 o'clock, 8 o'clock, 9 o'clock, 10 o'clock, 11 o'clock, and 12 o'clock points along circumferential path 321) were found to travel along uniform, radial paths 351, 352, 353, 354, 355, 356, 357, 358, 359, 360, 361, and 362 respectively directly out of the plating solution taking the shortest exit path from the point from which it was placed to primary weir 305.

Figure 3B:
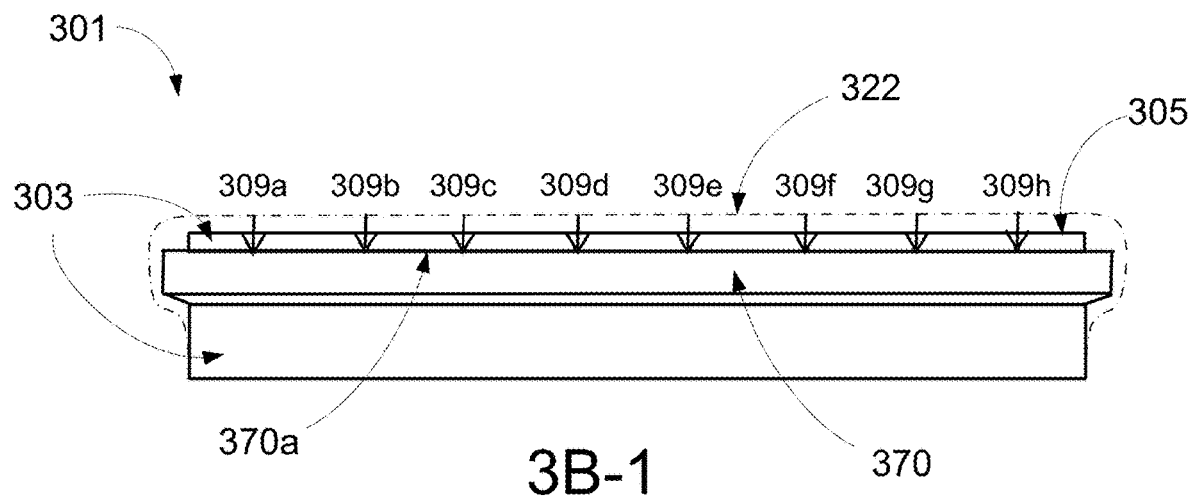
FIG. 3B depicts schematic illustrations of a side-view of weir wall wetting and a top view of fluid overflow behavior of a tilted electroplating cell in accordance with disclosed embodiments.
Figure 3B:
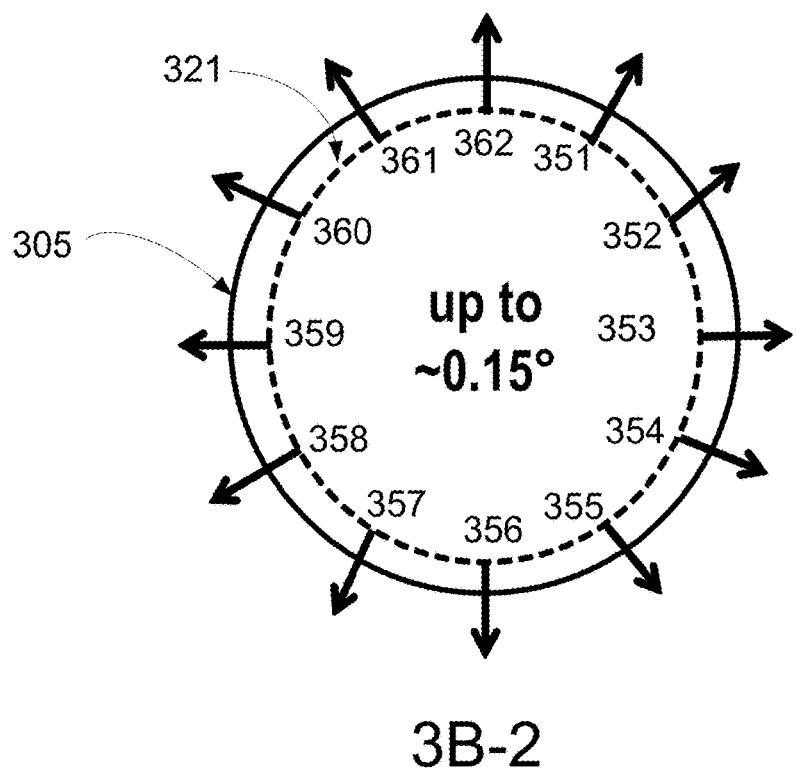

The same effect is shown in tilted electroplating cells. In some experiments, the effect is maintained in cells having a tilt of up to about 0.15°, a significant tilt because in standard electroplating cells, when cells were tilted over 0.1°, gravity began pulling fluid downwards. FIG. 3B depicts two views of plating solution fluid behavior on a tilted electroplating cell with a secondary weir. FIG. 3B-1 is a side-view of a tilted electroplating cell with outer region 303 near primary weir 305 of chamber wall 301 with secondary weir 370. Plating solution 322 flows over primary weir 305 of chamber wall 301 onto surface region 370a of the secondary weir 370 where it pools before flowing over secondary weir 370 and down onto or past the outer region 303. As shown, plating solution uniformly flows out of the chamber along paths 309a, 309b, 309c, 309d, 309e, 309f, 309g, and 309h. Radial overflow is consistent with the behavior shown in FIG. 3A-1.

FIG. 3B-2 is a top view of plating solution fluid flow behavior in a tilted electroplating cell with a secondary weir. Like FIG. 1B-1, bubbles may be placed 150 millimeters from the center of the surface of the plating solution at each of 1 o'clock, 2 o'clock, 3 o'clock, 4 o'clock, 5 o'clock, 6 o'clock, 7 o'clock, 8 o'clock, 9 o'clock, 10 o'clock, 11 o'clock, and 12 o'clock points along circumferential path 321. These bubbles were found to travel along uniform, radial paths 351, 352, 353, 354, 355, 356, 357, 358, 359, 360, 361, and 362 respectively directly out of the plating solution taking the shortest exit path from the point from which it was placed to the primary weir 305 despite being in a tilted electroplating cell. Radial overflow here is also consistent with a level cell with a secondary weir as depicted in FIG. 3A-2. Note the paths exhibit the same pattern in both the level cell in FIG. 3A and the tilted cell in FIG. 3B.

It is noted that in both level and tilted electroplating cells, the secondary weir 370 itself may be overflowed with plating solution uniformly or non-uniformly, but, without being bound by a particular theory, the trajectory of the fluid in the plating cell may not be impacted since it is located at an elevation below the primary weir 305 and the presence of the retained volume in the secondary weir 370 ensures continuous wetting of the outer region 303 of the chamber wall 301 below the primary weir 305 where fluid initially drops vertically from the primary weir 305. "Dry" regions are not as likely to develop near the top of outer region 303, so uniform radial overflow from the primary weir is assured. In the disclosed embodiments, use of a secondary weir 305 may improve plating solution flow behavior regardless of plating solution type. According to various embodiments, set up of plating cells may be dramatically easier to deliver reproducible flow performance and sensitivity to parameters such as cell leveling, weir wall flatness, airflow over the plating solution and surface finishes which may be hydrophobic or hydrophilic, may be reduced or eliminated.

Various secondary weir designs may be implemented. One example of a secondary weir is an integral weir such that the secondary weir and primary weir are each part of a monolithic structure. FIG. 4A depicts a comparison between a standard electroplating cell chamber wall design and a design including a secondary weir. The left is a depiction of a standard cell chamber wall 401a including a sloped edge 431a on the inner portion of the chamber, and a horizontal surface at the top of weir 405a where it meets the outer chamber wall 403a at 90°. Overflow fluid flows from the sloped region 431a up to weir 405a, and then drops abruptly down the vertical outer chamber wall 403a. Without being bound by a particular theory, this design does not promote uniform wetting of the outer region 403a of the chamber wall 401a.

The schematic illustration on the right is one implementation of a chamber wall 401 on an electroplating chamber. An inner slope 431 joins a primary weir 415 at a curved edge. The primary weir 415 meets a sloped top portion 433 of outer wall 403 downward to form a moat region 435, which is defined in part by a secondary weir 470. The top of secondary weir 470 is curved over to meet with outer region 403 of chamber wall 401. Here, overflow fluid flows up inner slope 431, flow over primary weir 415, slide down outer slope 433, pool at moat 435, flow over secondary weir 470, and flow down outer region 403 of chamber wall 401. Primary weir 415 and outer slope 433 remain continuously wet as a result of the pooling at moat 435, thereby encouraging azimuthally uniform fluid exit paths.

Figure 4B:
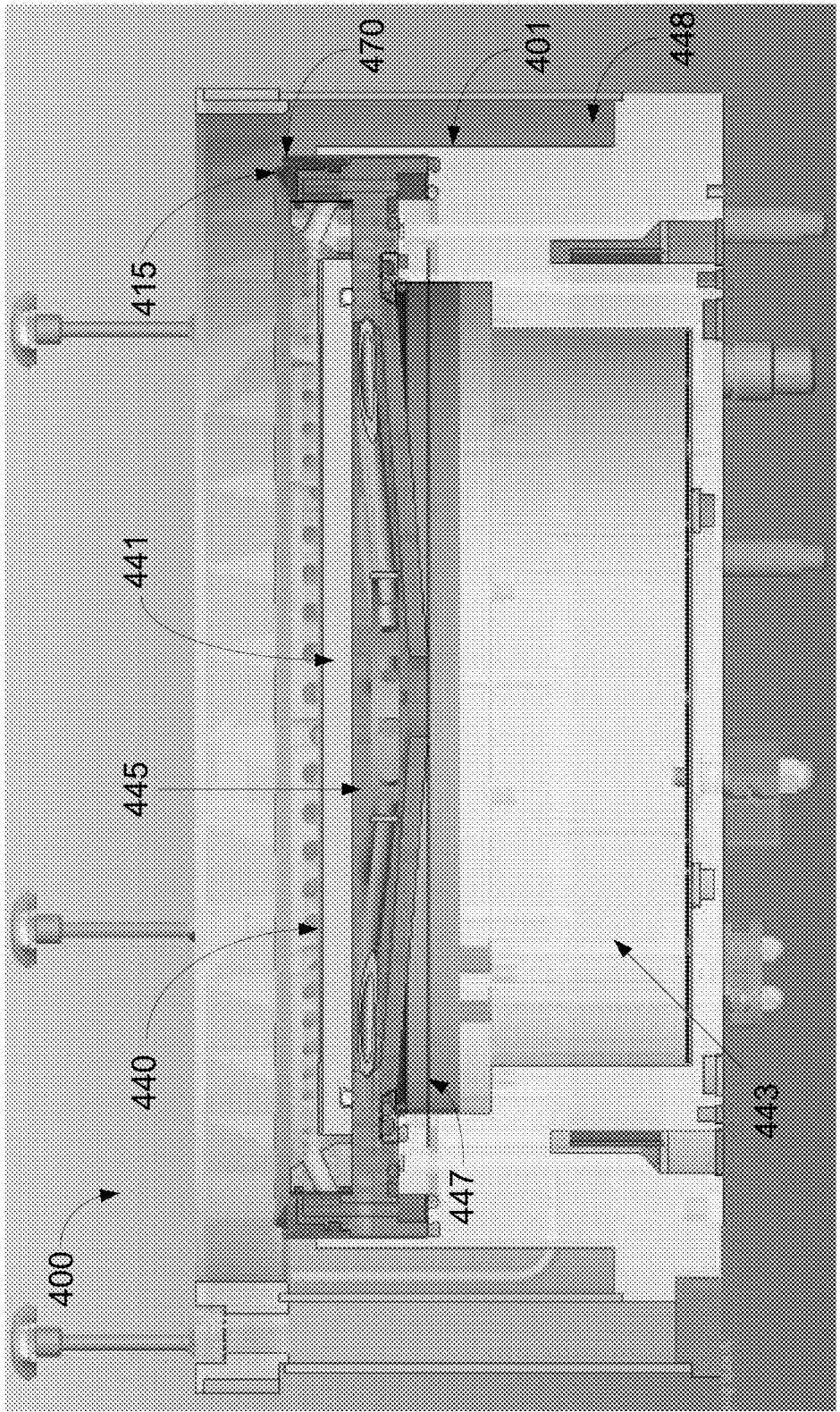
FIG. 4B is a side-view cross-section of an electroplating cell in accordance with disclosed embodiments.

FIG. 4B depicts a side-view cross-section of the secondary weir design in FIG. 4A in an electroplating cell 400. Similar to the cell in FIGS. 2A and 2B, electroplating cell 400 includes the secondary weir 470, primary weir 415, diffuser plate 441, field shaping insert 440, plating solution region 445, membrane 447, anode chamber 443, and overflowed plating solution collecting region 448. Plating solution flows into plating solution region 445 through a plating solution inlet flows over primary weir 415 to the secondary weir 470 down the outer region 403 of chamber wall 401 to plating solution collecting region 448.

Figure 4C:
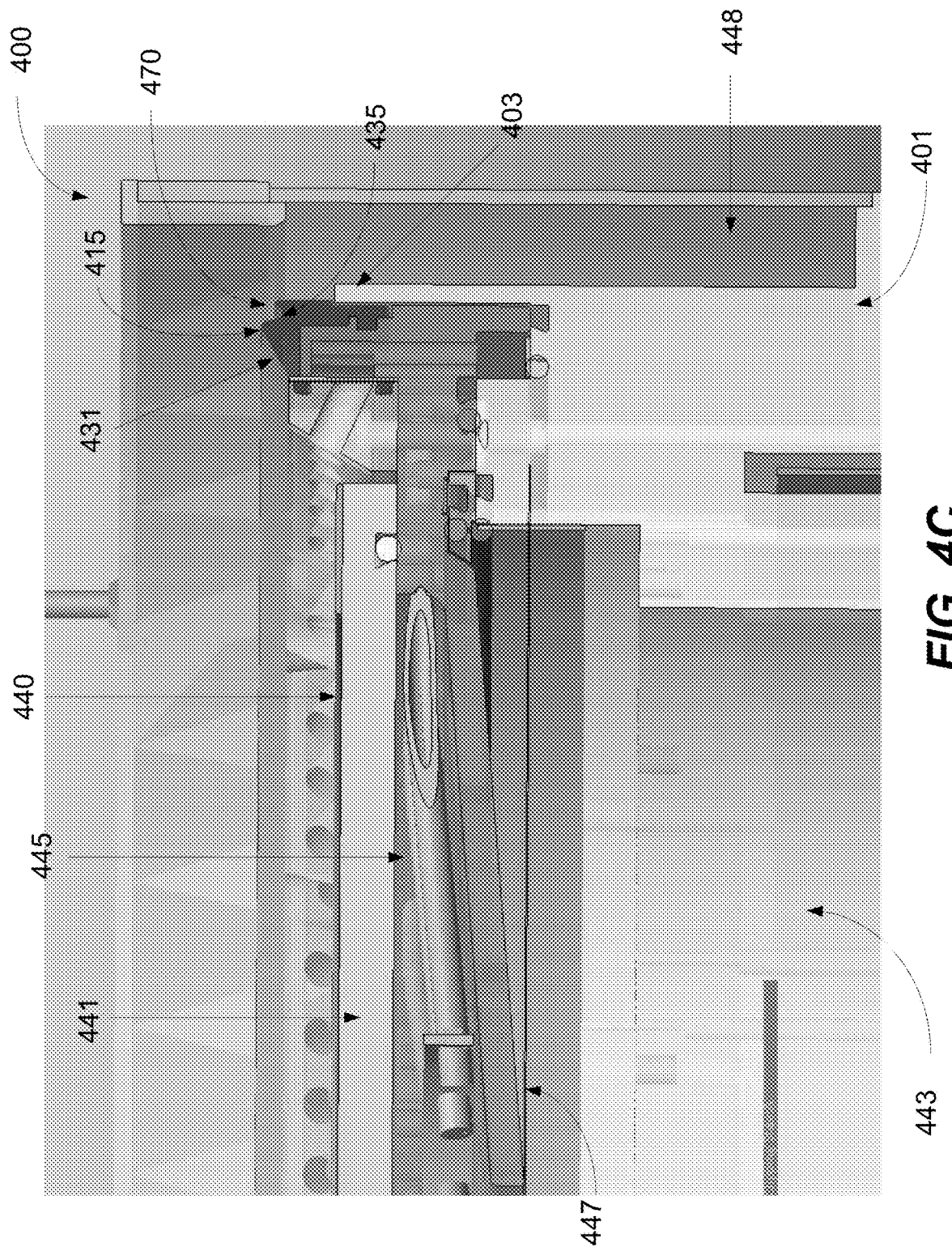
FIG. 4C is a side-view cross-section of a section of an electroplating cell in accordance with disclosed embodiments.

FIG. 4C depicts a closer view of a side-view cross-section of the secondary weir design in FIGS. 4A and 4B. Electroplating cell 400 includes secondary weir 470, primary weir 415, diffuser plate 441, field shaping insert 440, plating solution region 445, membrane 447, anode chamber 443, and overflowed plating solution collecting region 448. Plating solution flows into plating solution region 445 through a plating solution inlet and fills plating solution region 445. Then plating solution flows up inner slope 431 and over primary weir 415 to pool in moat 435 and flows over secondary weir 470 down the outer region 403 of chamber wall 401 to plating solution collecting region 448.

Monolithic, integral secondary weirs may be made of any suitable material used to form the chamber walls of an electroplating cell or apparatus. Examples of materials used include plastics such as polyethylene terephthalate (PET or PET-P), polypropylene, polytetrafluoroethylene (PTFE), and quartz.

Figure 5:
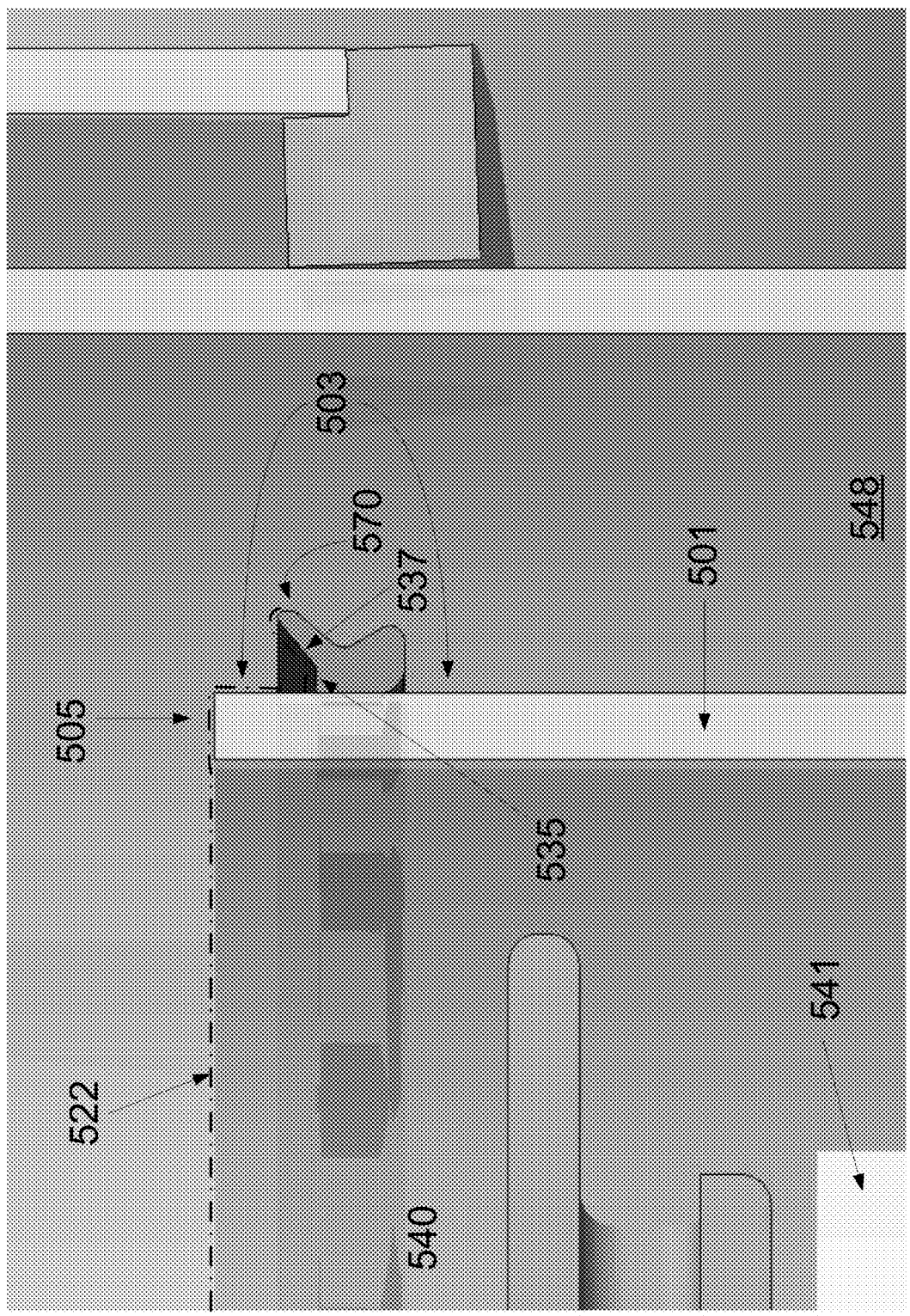
FIG. 5 is a side-view cross-section of a section of an electroplating cell in accordance with disclosed embodiments.

Another example of a secondary weir is a supplemental secondary weir such that the secondary weir is a field retrofit kit or replaceable component that may be attached to an appropriate electroplating chamber in a previously installed electroplating cell. Supplemental secondary weirs may vary in size and shape depending on the type of electroplating cell it is appended on and may be custom-made. Supplemental secondary weirs may be appended to a chamber by implementing hardware to handle and pull the secondary weir over and on top of a chamber and position the secondary weir at a designated position just below the primary weir. FIG. 5 depicts an example of a supplement secured and sealed on outer region 503 of the chamber wall 501 at a position below primary weir 505. The supplement features a moat 535, an upward slope 537, and a secondary weir 570. Here, overflow fluid 522 would travel over primary weir 505, flow down chamber wall 503, to pool at moat 535, fill the moat up slope 537 and flow over the secondary weir 570 and down chamber wall 503 in a collecting region 548 below.

Supplemental secondary weirs may be made of any elastomeric material. Examples of suitable elastomeric material include commercially available elastomer materials or rubber such as Viton®. Supplemental secondary weirs may be made of material suitable for affixing the supplement onto the outside wall of a chamber and around any other components already appended onto the outside wall of a chamber.

Various design implementations of a secondary weir are possible. The following components may vary in shape: any slopes from the inner wall of the chamber wall to the primary weir, the primary weir, any slopes connecting the primary weir and the moat, the moat, any slopes connecting the moat and the secondary weir, and the secondary weir.

Most moats may have an overall shape that is curved, sharp, or horizontal. The base of the moat may be curved to accumulate overflow fluid as shown in the right figure of FIG. 4A and FIG. 4B. A sharp moat may be formed where the slope from the primary weir to the moat and the slope from the secondary weir to the moat meet at a point. The base of the moat may be horizontal, such as the one shown in FIG. 5. The base of the moat may also be textured or may include additional features.

Figure 6:
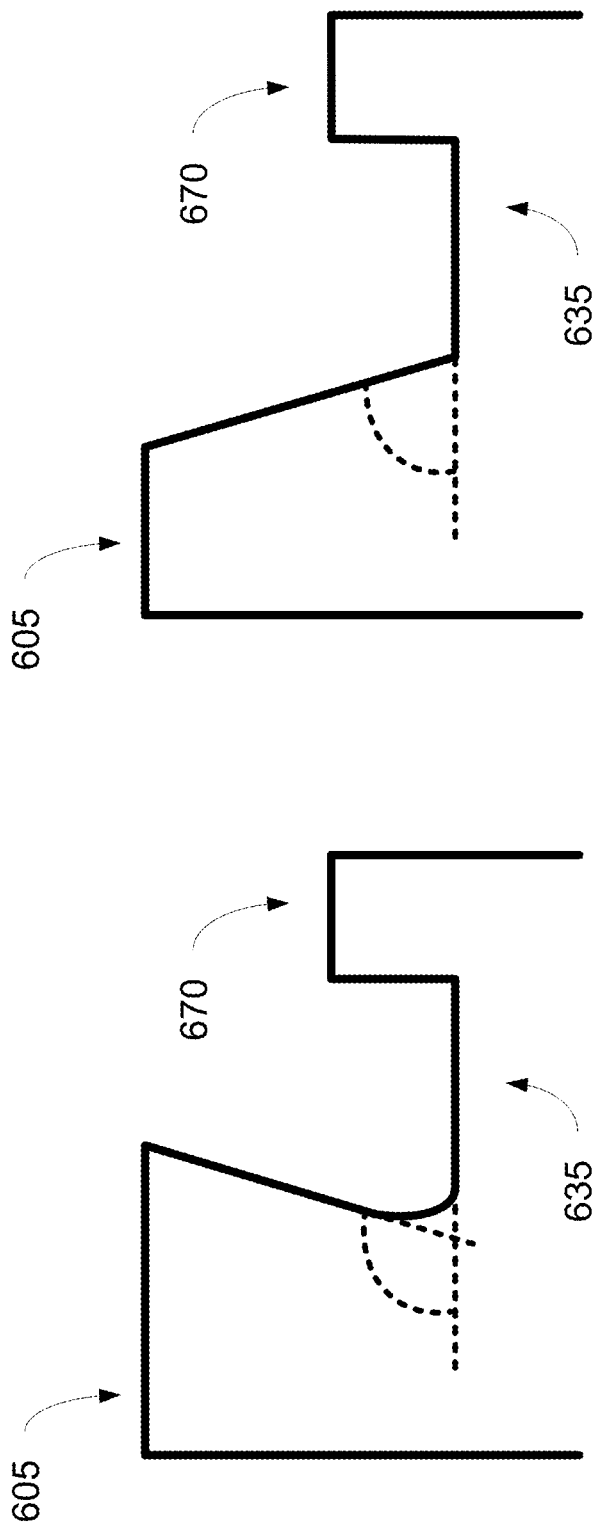
FIG. 6 depicts side-views of moats according to various embodiments.

Slope surfaces may be textured or smooth and slope designs may vary. Slopes may also meet parts of the primary and secondary weirs at various angles. For example, the slope from the primary weir to the moat may meet the moat at any angle between 0° and 180°, as shown in FIG. 6. The schematic illustrations depict primary weirs 605, secondary weirs 670, and moats 635. In the illustration on the left, the angle is greater than 90° whereas in the illustration on the right, the angle is less than 90°. In certain embodiments, the slope is between about 60° and 90°. The slope may also vary over the path from the primary weir to the moat such that the surface is curved or faceted. For example, a slope may meet the primary weir at a certain angle but meets the moat at a different angle, such that the surface of the slope is not flat, e.g., it is curved.

The top surface of the primary weir may be curved, slanted, or flat. An example of a primary weir with a curved top surface is shown in the right-side illustration of FIG. 4A, while an example of a primary weir with a flat top surface is shown in FIG. 5. A primary weir top surface may also be slanted, such that the top surface of the primary weir is angled down towards the outer surface of the chamber wall or vice versa.

For integral and supplemental secondary weirs, the secondary weir may be curved, slanted, or horizontal. The secondary weir may also be curved, such as the one shown in the right illustration of FIG. 4A. A secondary weir may also be slanted, such that the top surface of the secondary weir is angled down towards the outer surface of the chamber wall. A horizontal secondary weir may be formed such that the top of the secondary weir is merely a horizontal flat surface. In certain embodiments, the inner wall of the secondary weir (the wall facing the outer wall of the chamber) has, on average, an angle of between 0° and 120° (with 0° being horizontal) or between about 45° and 90°. For angles approaching 90° and larger, the inner wall of the secondary weir must be offset from the outer wall of the chamber by an appropriate distance. The offset may be accomplished using a flat bottom portion of a moat, for example.

Any combination of these implementations or any other appropriate design implementations may be used in accordance with the disclosed embodiments.

Dimensions of a secondary weir may depend on the type of electroplating cell it is being implemented upon. Secondary weir position is measured by using a reference point at the top of the primary weir and a reference point at the top of the secondary weir. The secondary weir may be positioned below the primary weir such that the vertical distance between the reference points of the two weirs is less than about 10 mm, or between about 1 mm and about 4 mm. As explained, the secondary weir may be positioned adjacent to the outer region of the chamber wall such that a moat is formed between the chamber wall and secondary weir, thereby permitting overflowed fluid to pool within the moat. The horizontal distance from the top of the secondary weir to the wall of the chamber from where the fluid initially flows over the primary weir may depend on the design implementation. The distance from the top of the secondary weir to the wall of the chamber may be between about 3 mm to about 8 mm. The depth of the moat may be between about 1 mm and about 5 mm, measured by the vertical distance between the top of the secondary weir and the lowest position of the moat.

In certain embodiments, one or more additional weirs, beyond the secondary weir, may be used. For example, tertiary and quaternary weirs may also be used on electroplating cells to further facilitate uniform overflow fluid behavior.

EXPERIMENTAL

Experiment 1

Figure 7:
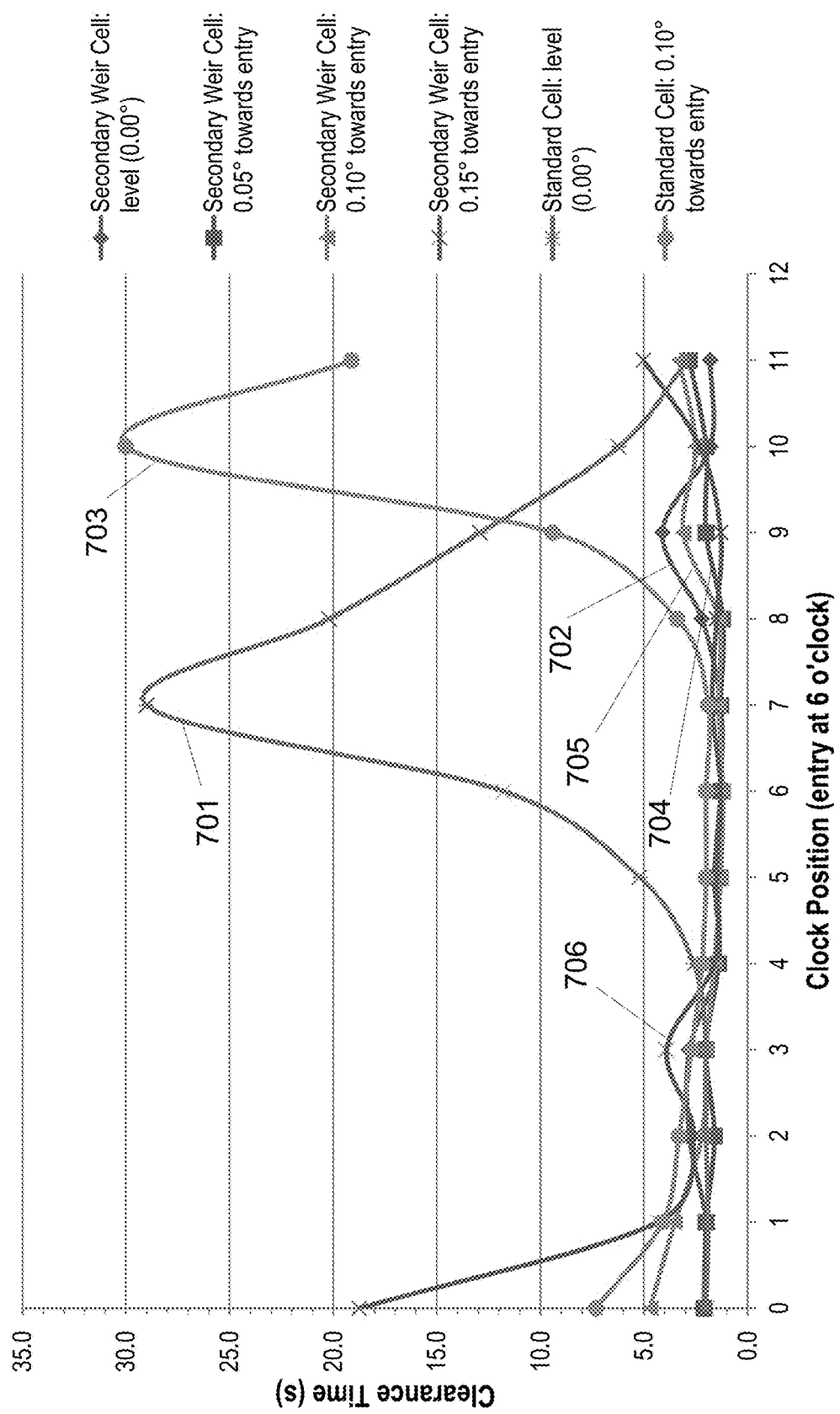
FIG. 7 is a graph comparing experimental data on bubble clearance times between standard electroplating cells and disclosed embodiments.

Bubble clearance tests were conducted on level and tilted standard electroplating cells and level and tilted electroplating cells with an implemented supplemental secondary weir. The standard electroplating cells used were Lam SABRE® IRISCell plating systems from Lam Research Corp. that previously never passed bubble clearance testing when the cell was level at 0.00° on two orthogonal axes. Secondary weirs were positioned between 3 and 4 mm below the primary weir, with a horizontal moat 2 mm from the top of the secondary weir. Bubbles were placed on the surface of the plating solution to test the fluid flow performance which would be replicated during an electroplating process to electroplate copper onto a 300 mm wafer. Bubbles were placed at the 1 o'clock, 2 o'clock, 3 o'clock, 4 o'clock, 5 o'clock, 6 o'clock, 7 o'clock, 8 o'clock, 9 o'clock, 10 o'clock, 11 o'clock and 12 o'clock positions at a circumferential distance 150 mm from the center of the surface of the plating solution in the plating chamber. Tilted wafers were entered at the 6 o'clock position. Bubbles were observed for each series of experiments and the time it took for a bubble to clear or exit the plating cell over the weir was recorded. Results of this series of experiments are shown in FIG. 7. In FIG. 7, the 12 o'clock position is represented by the 0 o'clock position.

A first series of experiments were done to observe fluid flow behavior in level standard electroplating cells. The results are shown in FIG. 7 and are depicted by curve 701. As shown, clearance times for bubbles entering at the 0 o'clock to 4 o'clock positions and 11 o'clock positions had clearance times of less than 5 seconds, but bubbles at the 5 o'clock, 6 o'clock, 7 o'clock, 8 o'clock, 9 o'clock, and 10 o'clock had clearance times of over 5 seconds, reaching a high of 29 seconds for the 7 o'clock bubble to clear the edge of the chamber wall. These high clearance times suggest that bubbles took a rather long and random route before leaving the chamber, instead of a direct radial route from the point of placement to the edge of the chamber.

A second series of experiments were done to observe fluid flow behavior in level electroplating cells with a supplemental secondary weir. The results are shown in FIG. 7 and are represented by curve 702. As shown, clearance times for bubbles entering at all positions had clearance times less than 5 seconds. Even the bubble that took the longest to leave at a clearance time of around 4 seconds still cleared the surface in less than 5 seconds. Visual observations confirmed that bubbles traveled radially outward from the point of placement to the edge of the chamber wall in a uniform manner.

A third series of experiments were done to observe fluid flow behavior in a 0.1° tilted standard electroplating cells. The results are shown in FIG. 7 and are represented by curve 703. As shown, clearance times for bubbles that entered at the 1 o'clock position to 8 o'clock position had clearance times of less than 5 seconds, but bubbles at 0 o'clock, 9 o'clock, 10 o'clock, and 11 o'clock exhibited longer clearance times up to a maximum of 30 seconds before clearing the chamber wall.

A fourth, fifth, and sixth series of experiments were done to observe fluid flow behavior in tilted electroplating cells with a supplemental secondary weir where tilt angles were towards the 6 o'clock entry position at 0.05°, 0.1°, and 0.15° respectively. The results are shown in FIG. 7 and are represented by curves 704, 705, and 706 respectively. As shown, clearance times for bubbles entering at all positions for all three series of experiments were less than 5 seconds. It is noted that generally, the trend of clearance times were all consistently lower than even the lowest clearance times of curve 703, which represents the 0.1° tilted standard electroplating cell results. From this data, secondary weirs can be used for tilted electroplating cells with a tilt up to 0.15°, unexpectedly surpassing the general maximum tilt in standard electroplating cells before gravity begins to pull fluid towards the tilting point.

Experiment 2

Bubble clearance tests were conducted to evaluate bubble clearance times in other electroplating cells with secondary weirs. Experiments were conducted on a Lam SABRE® NeXT plating system, available from Lam Research Corp. using HA Plus chemistry. The temperature of the plating bath was set at 25° C. All measurements were taken with "top hats" on for Cells 2 and 3, with all doors opened. Top hats are located above the periphery of the NeXT cells and are used as splash guards and to promote uniform airflow over the plating cell. Plating occurred in Cell 1. The plating cell was set up using a donut ring-shaped leveling fixture designed to sit on the primary weir wall with a three-point contact and a digital two-axis level to determine the angle of the plating cell. Pump flow was monitored throughout using an ultrasonic flow meter.

Figure 8:
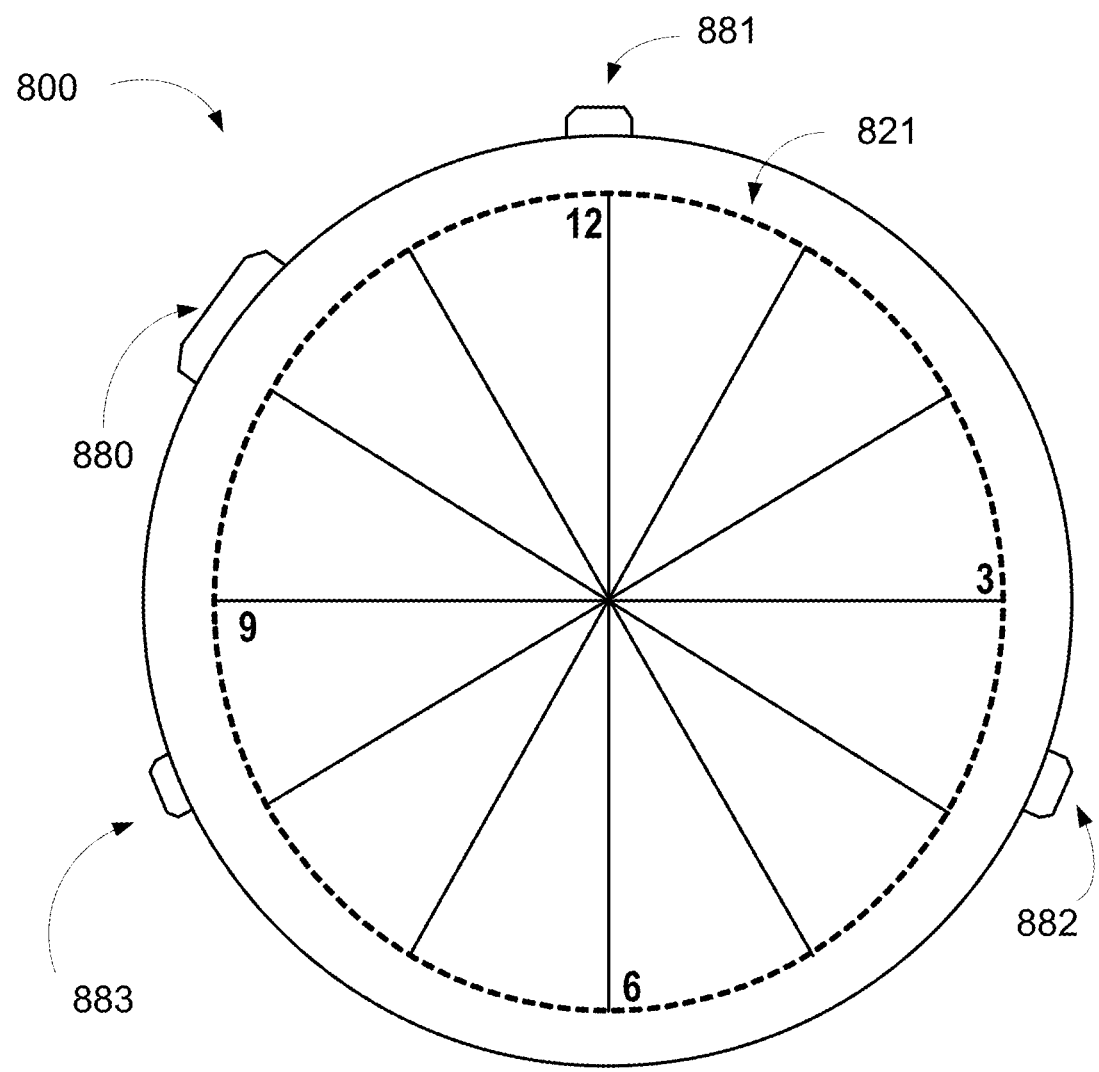
FIG. 8 depicts a schematic illustration of the top view of an electroplating cell.

FIG. 8 depicts a schematic illustration of the top of the plating cell used in this experiment. As shown, four pockets 880, 881, 882, and 883 are on the outer region of the chamber wall where cables and other wiring may be inserted to operate plating cell 800. These pockets render the outer circumference of the cell 800 uneven. A supplemental secondary weir (not shown) was placed on the plating cell just below the primary weir and around the pockets. Bubbles were dispensed freehand using the HRVA insert edge as the reference start diameter 821.

Figure 9A:
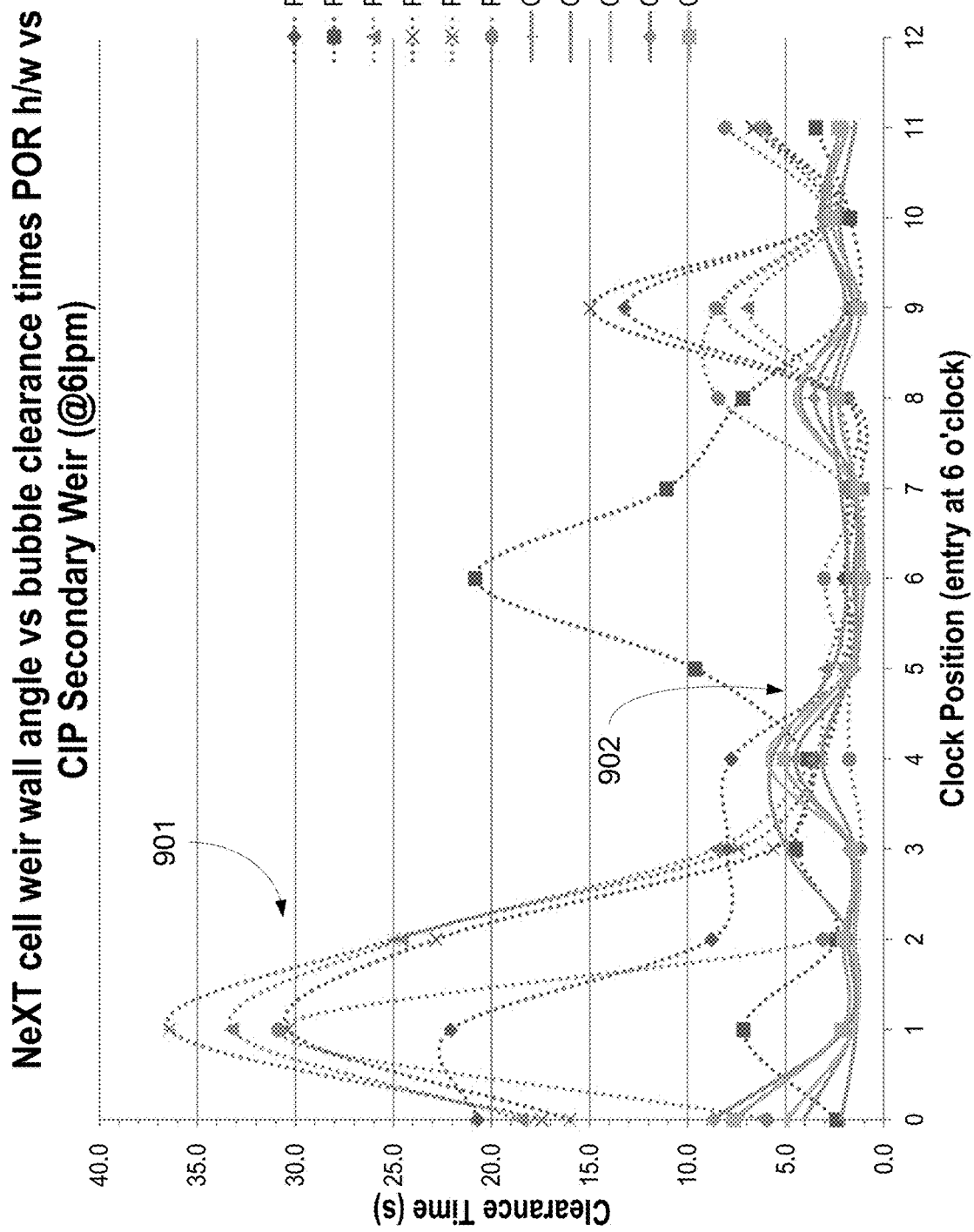
FIG. 9A is a graph comparing experimental data on bubble clearance times between standard electroplating cells and disclosed embodiments.

Trials were run for plating cells without secondary weirs and the results are shown in FIG. 9A. Bubble clearance tests were conducted on level cells and tilted cells with a tilt 0.05°, 0.10°, 0.15°, and −0.10°. Dotted lines 901 represent the clearance times for plating solution in these plating cells without secondary weirs. Supplemental retrofit secondary weirs were implemented on the cells and bubble clearance tests were conducted for level and tilted embodiments. The results are represented by the solid lines 902.

Figure 9B:
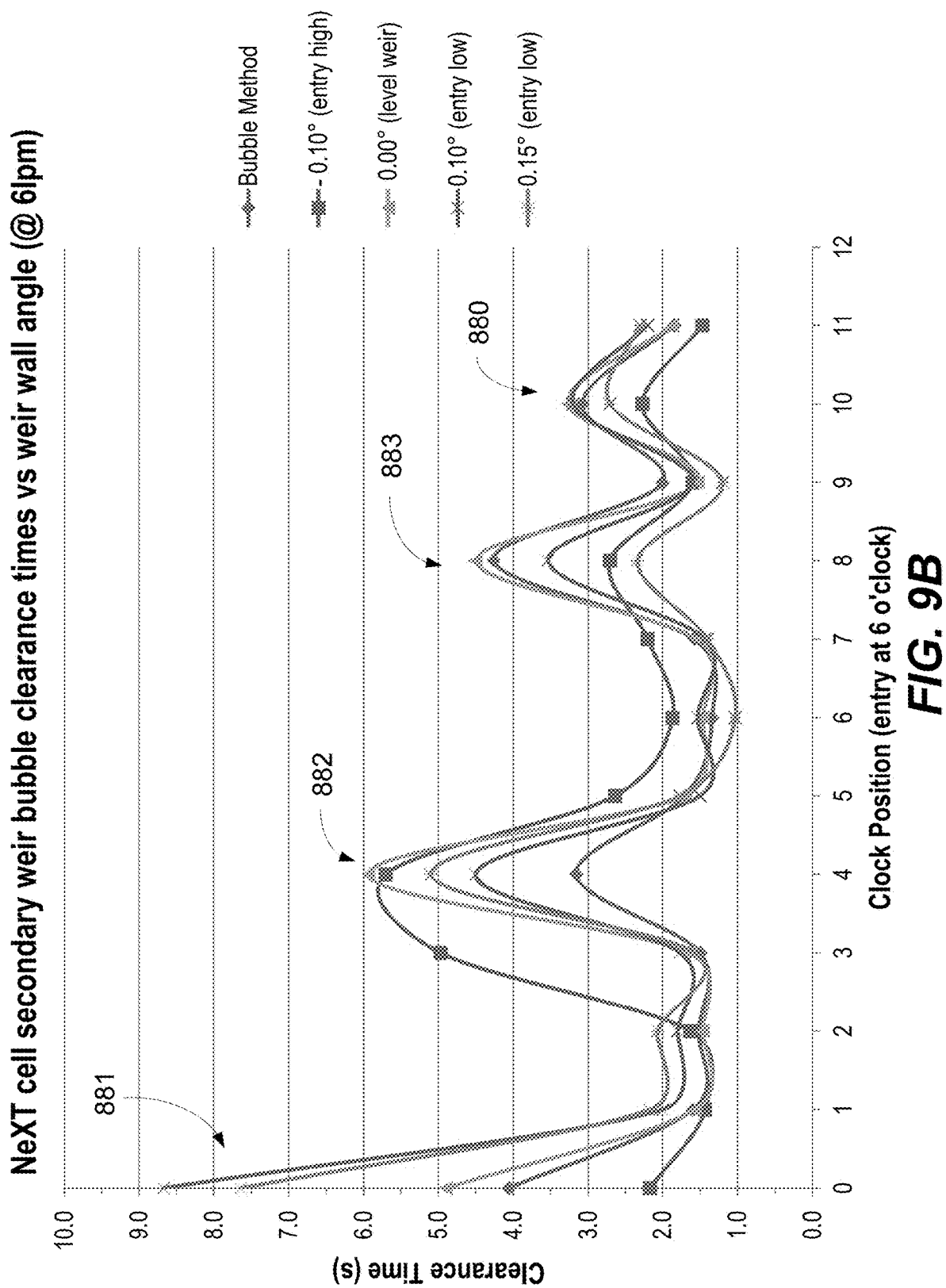
FIG. 9B is a graph comparing experimental data on bubble clearance times in disclosed embodiments.

A closer view of the solid lines in FIG. 9A is shown in FIG. 9B. Higher clearance times were shown at the 0 o'clock position, 4 o'clock position, 8 o'clock position, and 10 o'clock position, which are associated with the locations of pockets 881, 882, 883, and 880 as shown in FIG. 8. It was observed that since the supplemental weir was secured around these pockets, the secondary weir was not tightly sealed in the corners where the pockets were connected to the smooth continuous surface of the chamber wall, resulting in small gaps where fluid drained from the secondary weir moat and therefore where dry regions could form. Despite this, as shown in FIGS. 9A and 9B, use of the secondary weir substantially decreased clearance time such that all clearance times in lines 902 were less than 10 seconds.

Figure 10:
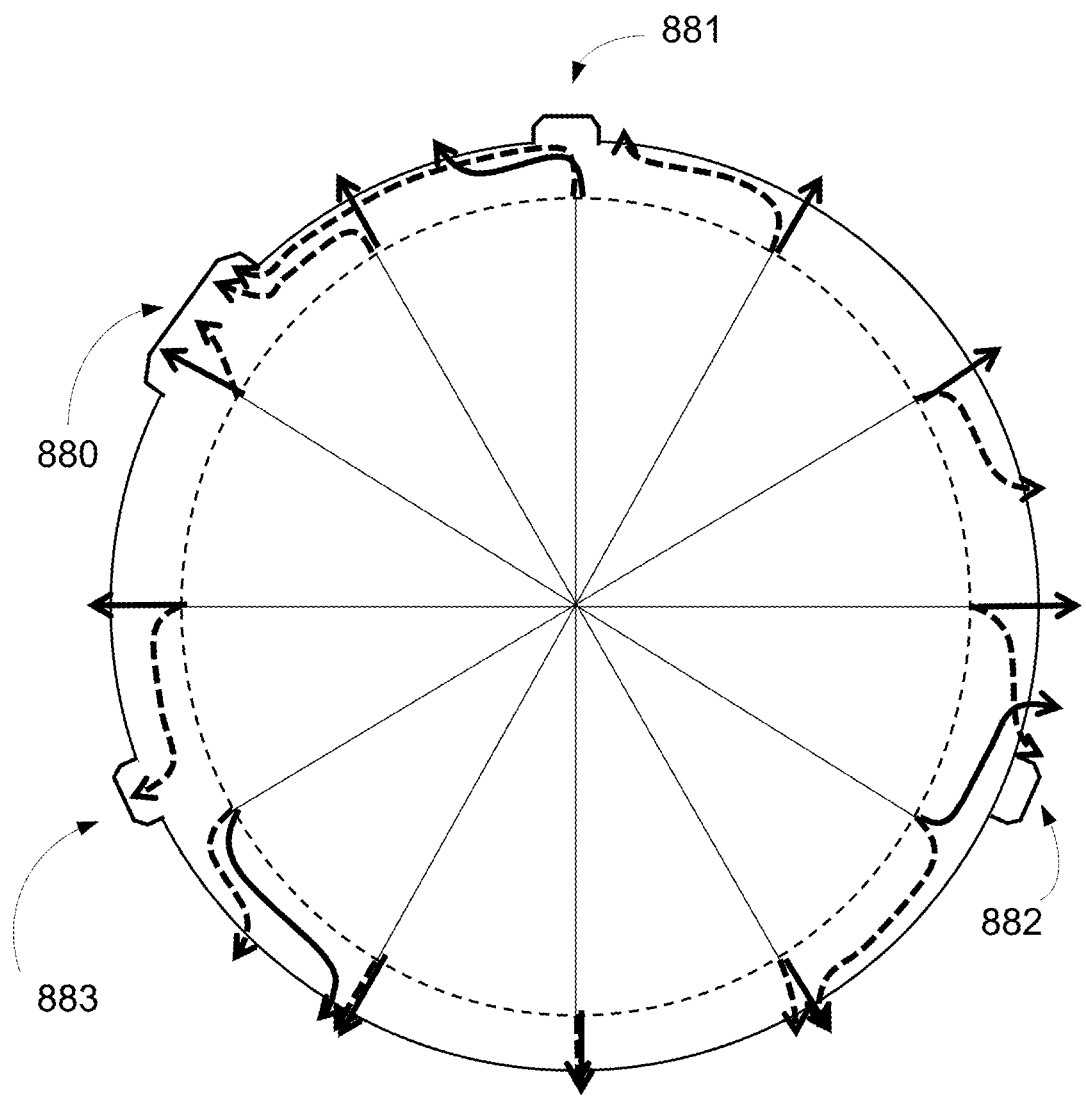
FIG. 10 depicts a schematic illustration of the top view of bubble trajectories for standard level electroplating cells and disclosed embodiments.

FIG. 10 is a depiction of a level electroplating cell with pockets 880, 881, 882, and 883. The dotted arrows represent the bubble trajectories of the electroplating cell without a secondary weir. Bubble clearance times averaged 8.0 seconds with a range of 20.8 seconds and a standard deviation of 7.3 seconds. The solid arrows represent the bubble trajectories of the electroplating cell with a supplemental secondary weir. Bubble clearance times averaged 2.6 seconds with a range of 4.5 seconds and a standard deviation of 1.6 seconds. The clearance times in electroplating cells with secondary weirs was substantially decreased.

Figure 11:
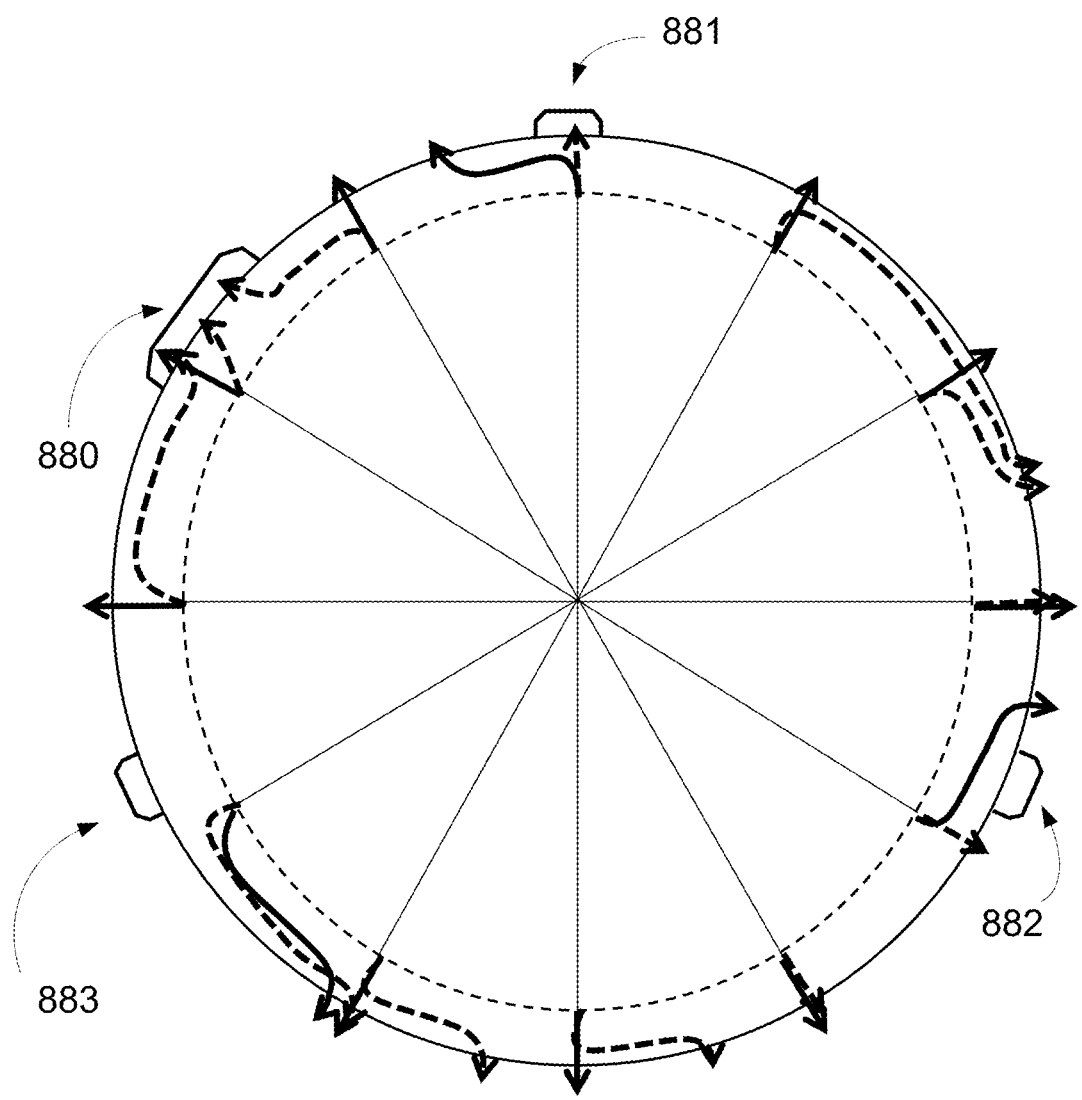
FIG. 11 depicts a schematic illustration of the top view of bubble trajectories for standard tilted electroplating cells and disclosed embodiments.

FIG. 11 is a depiction of a tilted electroplating cell with pockets 880, 881, 882, and 883. The readings on the two level points read 0.02° and 0.09°. The dotted arrows represent the bubble trajectories of the electroplating cell without a secondary weir. Bubble clearance times averaged 6.5 seconds with a range of 29.7 seconds and a standard deviation of 8.2 seconds. The solid arrows represent the bubble trajectories of the electroplating cell with a supplemental secondary weir. Bubble clearance times averaged 2.3 seconds with a range of 2.9 seconds and a standard deviation of 1.0 seconds.

As shown in FIGS. 9B, 10, and 11, bubbles near the pockets at the 0 o'clock, 4 o'clock, 8 o'clock, and 10 o'clock positions exhibited non-radial trajectories and toward a wet region, resulting in dry regions where the pockets were in both level and tilted plating cells. Nonetheless, the depictions show that plating solution generally overflows in a radial direction outward in electroplating cells with secondary weirs.

An apparatus may be amended to seal a retrofit supplemental secondary weir closer to the corner where the pockets meet the surface of the chamber wall such that plating solution can flow onto a secondary weir at the pockets. Plastic flathead screws or other structure may be inserted close to the outer wall of the cell to press against the secondary weir at locations where it separates from the contour of the outer wall (e.g., at sharp angles where pockets engage with the cell). This promotes continuous wetting of the entire circumference of the plating cell chamber wall to achieve azimuthally more uniform flow. Such a solution has also been implemented and demonstrated—results were further improved as shown in Table 1 below, which compares results from using a standard plating cell, plating cell with secondary weir, and a modified secondary weir secured with flathead screws.

Statistics were calculated for bubble clearance times in standard plating cells and electroplating cells with a secondary weir, as well as for electroplating cells with a modified secondary weir. The results are shown in Table 1 below.

TABLE 1

Bubble Clearance Times in Standard vs. Secondary Weir (in seconds)

| Hardware | Tilt | Min | Max | Range | Average | Standard Deviation |
|---|---|---|---|---|---|---|
| Standard Plating Cell | 0.00° | 1.3 | 22.1 | 20.8 | 8.0 | 7.3 |
| | −0.10° | 1.6 | 20.8 | 19.2 | 6.3 | 5.5 |
| | 0.05° | 1.1 | 33.2 | 32.1 | 9.3 | 10.5 |
| | 0.10° | 1.8 | 30.4 | 28.6 | 9.2 | 9.7 |
| | 0.15° | 1.3 | 36.4 | 35.1 | 9.6 | 11.1 |
| | Bubble | 1.2 | 30.9 | 29.7 | 6.5 | 8.2 |
| Plating Cell with Secondary Weir | Bubble | 1.3 | 4.3 | 2.9 | 2.3 | 1.0 |
| | −0.10° | 1.4 | 5.7 | 4.3 | 2.6 | 1.4 |
| | 0.00° | 1.5 | 5.9 | 4.5 | 2.6 | 1.6 |
| | 0.10° | 1.4 | 8.7 | 7.2 | 2.8 | 2.1 |
| | 0.15° | 1.0 | 7.6 | 6.6 | 2.6 | 1.9 |
| Plating Cell with Secondary Weir Secured by Flathead Screws | −0.07° | 1.5 | 3.6 | 2.1 | 2.1 | 0.6 |

Overall averages and ranges of clearance times were substantially lower in plating cells with secondary weirs in both level and tilted cells as compared to the standard plating cell. The results of the tilted plating cell with secondary weir secured by flathead screws showed the smallest standard deviation with decreased range and average in clearance times.

Method

Provided herein are methods to electroplate metal onto wafers using an electroplating cell including a secondary weir to produce substantially defect-free uniform wafers. Generally, the methods employ electroplating substrates in a plating cell employing a secondary weir as disclosed herein. The methods involve flowing electrolyte over the primary weir wall and onto a moat formed with a secondary weir outside the primary weir. This overflow process may occur during electroplating and/or between electroplating operations.

Figure 12:
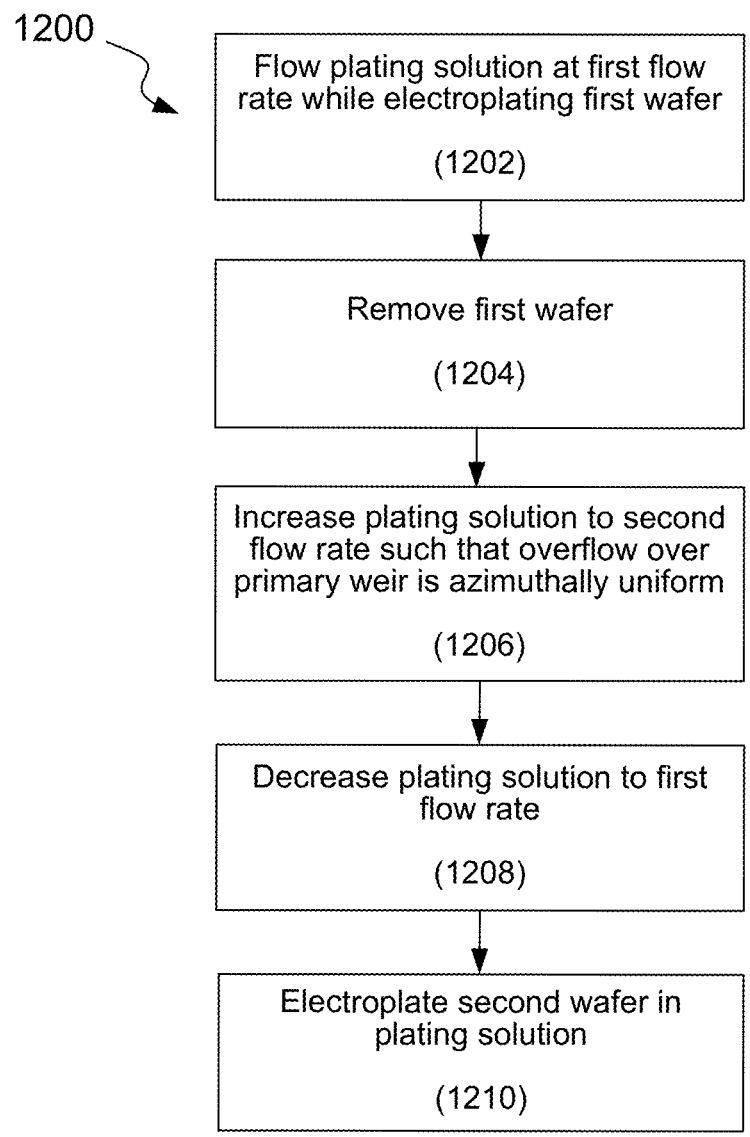
FIG. 12 is a process flow diagram for electroplating processes in accordance with disclosed embodiments.
Figure 13:
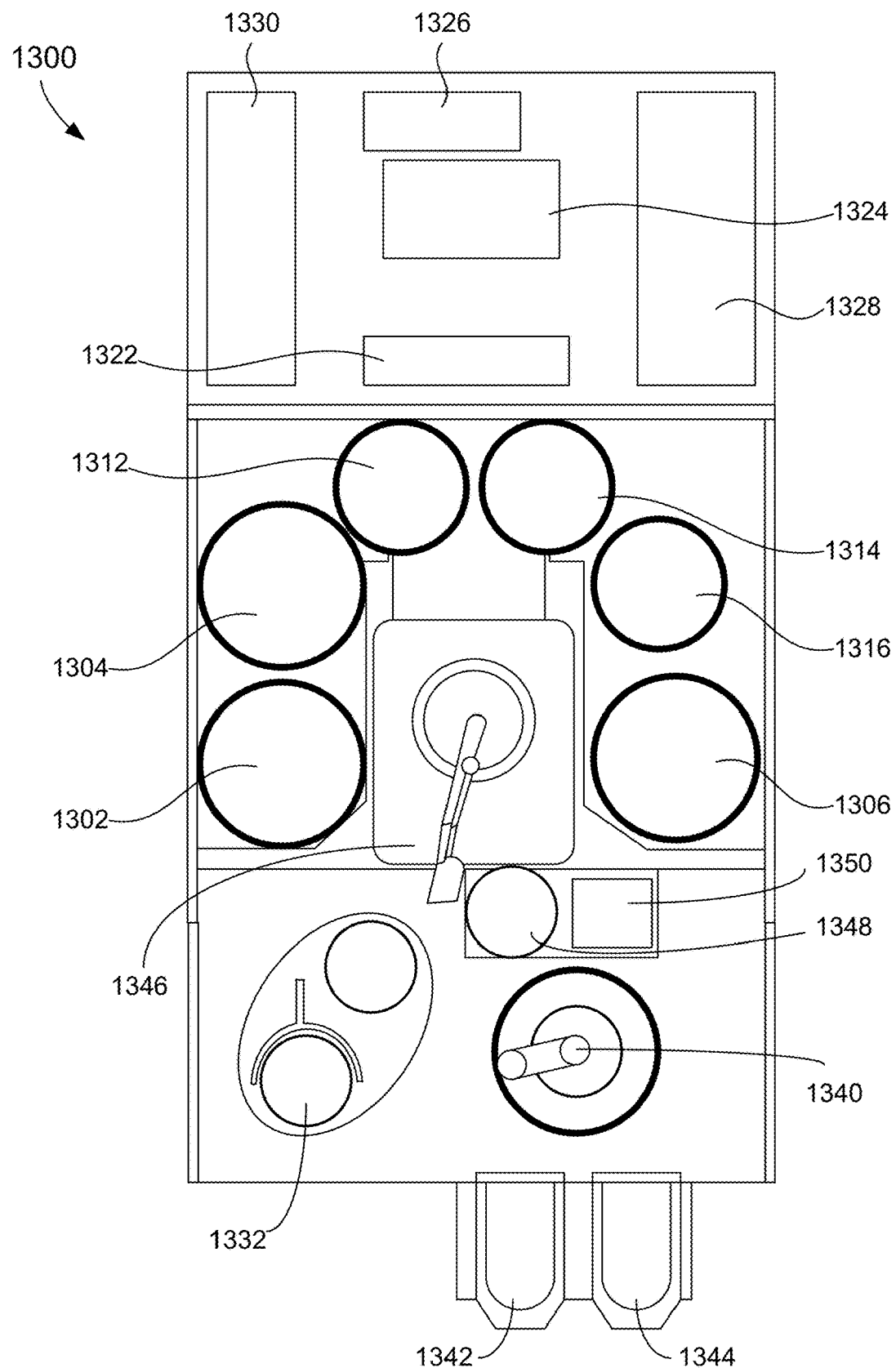
FIG. 13 is a schematic illustration of an electroplating apparatus that may be used for practicing various embodiments.

Referring to FIG. 12, method 1200 provides one embodiment to electroplate wafers in an electroplating cell in accordance with the apparatuses disclosed herein. In operation 1202, plating solution is flowed into the electroplating cell at a first flow rate through a plating solution inlet while a first wafer is submerged in the electroplating solution for the electroplating process. Plating solution is continuously flowed such that the plating chamber, which is filled to the rim with plating solution, overflows into a plating solution collecting region outside of the chamber in the electroplating cell. Plating solution at the surface of the chamber flows over the primary weir on the chamber wall, down the outside region of the chamber wall, into a moat up a slope, over a secondary weir, and down the outside region of the chamber into the plating solution collecting region. Overflowed plating solution may then be delivered out of the electroplating cell, filtered, and recirculated into the plating bath within the chamber. In certain embodiments, operation 1202 may last at least about 30 seconds, depending on the desired deposition thickness of the metal.

In operation 1204, the first wafer may be removed from the plating solution. In operation 1206, the plating solution flow rate may be increased to a second flow rate. This increased flow rate may serve to remove particles, bubbles, or other defect-causing debris from the plating solution. Ideally, such debris is quickly removed so that the cell has little downtime between successive electroplating operations. During this operation, in many embodiments, plating solution flows over a primary weir to a secondary weir positioned at a region below the primary weir where the overflowed plating solution pools and remains in contact with the plating solution overflowing the primary weir. In various embodiments, the overflow of the plating solution over the primary weir is substantially azimuthally uniform. Here, integral secondary weirs such that the secondary and primary weirs are a monolithic structure may be used in some embodiments. Supplemental weirs may also be used in some embodiments. Secondary, tertiary, quaternary, and other variations of weirs may be used according to some embodiments. Without being bound by any particular theory, it is believed that increasing flow rate may flush out any unwanted particles, debris, or bubbles in the plating solution to avoid defects in the next plating cycle.

In operation 1208, the plating solution flow rate may be decreased to about the first flow rate. Then, in operation 1210, a second wafer is lowered into the plating solution such that the second wafer contacts the flowing plating solution to be electroplated.

Wafers may be 200 mm, 300 mm, or 450 mm wafers for use as fabricated integrated circuits or semiconductors. Example plating solutions include aqueous copper II salts, acid or base, and one or more organic plating additives that facilitate rapid "bottom up" electrofill in features. The first flow rate during electroplating may be between about 2 L/min and about 20 L/min, or between about 5 L/min and about 12 L/min, or about 6 L/min.

Application

Electroplating methods and apparatuses disclosed herein may be practiced in accordance with many different types of electroplating systems. In certain embodiments, an electroplating system includes a dosing system that alters the chemical composition of a plating solution reservoir. Anode and cathode electrolyte delivery systems may deliver anode and cathode electrolyte (sometimes referred to as "anolyte"

and "catholyte" respectively) to an electroplating cell. The anode electrolyte delivery system may be a closed loop system that circulates anode electrolyte. Excess anode electrolyte may be returned to the reservoir as needed. The anolyte delivery system may also be an open loop system. The cathode electrolyte delivery system may circulate and return plating solution. The cathode electrolyte and anode electrolyte may have the same or different chemical compositions and properties. For example only, the anode electrolyte may be substantially free of organic bath additives while the cathode electrolyte may include organic bath additives.

In some embodiments, the anode region may be a separated anode chamber (SAC) positioned towards the bottom of the electroplating cell, with a membrane and frame separating the top plating bath region where the wafer is lowered in from above for deposition of a metal. In various embodiments, the electrolyte in the SAC is an aqueous solution of between about 10 and about 50 gm/L copper and between 0 and about 200 gm/L $H_2SO_4$.

The membrane may be supported by a membrane frame. Alternative boundary structures such as sintered glass or porous polyolefins may be used in place of the membrane or the membrane may be omitted. The membrane may be electrically dielectric and may include micro-porous media that is resistant to direct fluid transport. For example only, the cationic membrane may include membranes sold under the trade name Nafion®, which are available from Dupont Corporation of Wilmington Del. Electroplating apparatuses having membranes for forming SACs are described in U.S. Pat. No. 6,527,920 issued to Mayer et al., and U.S. Pat. Nos. 6,126,798 and 6,569,299 issued to Reid et al., which are all herein incorporated by reference in their entireties.

An anode may be arranged in an anode chamber and may include a metal or metal alloy. According to some embodiments, the metal or metal alloy may include copper, copper/phosphorous, lead, silver/tin or other suitable metals. In certain embodiments, the anode is an inert anode (sometimes referred to as a "dimensionally stable" anode). The anode is electrically connected to a positive terminal of a power supply. A negative terminal of the power supply may be connected to a seed layer on the substrate.

Flow of anode electrolyte may be fed into the anode chamber via a central port and passing through anode. Optionally, one or more flow distribution tubes may be used to deliver anolyte. When used, the flow distribution tubes may supply anode electrolyte in a direction towards a surface of the anode to increase convection of dissolved ions from the surface of the anode.

The flow of anode electrolyte may exit the anode chamber at via manifolds and return to an anode electrolyte bath for recirculation. In some implementations, the membrane may be conically-shaped to reduce collection of air bubbles at a central portion of the membrane. In other words, the anode chamber ceiling has a reverse conical shape. A return line for plating solution may be arranged adjacent to radially outer portions of the membrane.

While the anode is shown as a solid, the anode may also include a plurality of metal pieces such as spheres or another shape arranged in a pile. When using this approach, an inlet flow manifold may be arranged at a bottom of the anode chamber. Flow of the electrolyte may be directed upward through a porous anode terminal plate.

The anode electrolyte may be optionally directed by one or more of the flow distribution tubes onto a surface of the anode to reduce a voltage increase associated with the build-up or depletion of dissolved active species. This approach may also tend to reduce anode passivation.

An anode chamber and a cathode chamber or plating solution region may be separated by the membrane. Cations travel from the anode chamber through the membrane and the cathode chamber to the substrate under the influence of the applied electric field. The membrane may substantially block diffusion or convection of non-positively charged electrolyte components from traversing the anode chamber. For example, the membrane may block anions and uncharged organic plating additives.

The cathode electrolyte supplied to the cathode chamber may have different chemistry than the anode electrolyte. For example, the cathode electrolyte may include additives such as accelerators, suppressors, levelers, and the like. For example only, the cathode electrolyte may include chloride ions, plating bath organic compounds such as thiourea, benzotrazole, mercaptopropane sulphonic acid (MPS), dimercaptopropane sulphonic acid (SPS), polyethylene oxide, polyproplyene oxide, and/or other suitable additives.

In various embodiments, cathode electrolyte may enter the cathode chamber and travel through a manifold to one or more flow distribution tubes. The flow distribution tubes may be omitted in some implementations. For example only, the flow distribution tubes may include a non-conducting tubular material, such as a polymer or ceramic. For example only, the flow distribution tubes may include hollow tubes with walls composed of small sintered particles. For example only, the flow distribution tubes may include a solid walled tube with holes drilled therein.

One or more of the flow distribution tubes may be oriented with openings arranged to direct fluid flow at the membrane. The flow distribution tubes may also be oriented to direct fluid flow to regions in the cathode chamber other at the membrane. A discussion of plating apparatus having fluted flow distribution tubes is contained in U.S. patent application Ser. No. 12/640,992 filed Dec. 17, 2009 by Mayer et al. and incorporated herein by reference in its entirety.

The electrolyte may eventually travel through a flow diffuser and pass near a lower surface of the substrate. The electrolyte may exit the cathode chamber over a primary weir, then pool in a moat, flow over a secondary weir and into a collecting region to be filtered and recirculated back into the plating solution.

For example only, the flow diffuser may include a microporous diffuser, which is usually greater than about 20% porous. Alternately, the flow diffuser may include an ionically resistive channeled plate, also sometimes called a high resistance virtual anode (HRVA) plate, such as one shown in U.S. Pat. No. 7,622,024, issued Nov. 24, 2009, which is hereby incorporated by reference in its entirety. The channeled plate is typically less than about 5% porous and imparts higher electrical resistance. In other implementations, the flow diffuser may be omitted.

Various patents describe electroplating apparatuses containing separated anode chambers that may be suitable for practice with the embodiments disclosed herein. These patents include, for example, U.S. Pat. Nos. 6,126,798, 6,527,920, and 6,569,299, each previously incorporated by reference, as well as U.S. Pat. No. 6,821,407 issued Nov. 23, 2004, and U.S. Pat. No. 6,890,416 issued May 10, 2005, both incorporated herein by reference in their entireties. The disclosed embodiments may also be practiced with apparatus and methods designed for simultaneously depositing two or more elements (e.g., tin and silver) such as those described in U.S. patent application Ser. No. 13/305,384, which is incorporated herein by reference for all purposes.

In various embodiments, the electroplating apparatus used with the systems described herein has a "clamshell" design. A general description of a clamshell-type plating apparatus having aspects suitable for use with this disclosure is described in detail in U.S. Pat. No. 6,156,167 issued on Dec. 5, 2000 to Patton et al., and U.S. Pat. No. 6,800,187 issued on Oct. 5, 2004 to Reid et al, which are incorporated herein by reference for all purposes.

A system may be implemented to regulate pressure in one or more anode chambers. A first and a second anode chambers may include membranes arranged between the anode chamber and a corresponding cathode chamber. The system may regulate pressure in the anode chambers without requiring precision pumps and/or pressure feedback, which reduces cost and complexity.

Deionized (DI) water source may provide deionized water via a valve to a conduit. A plating solution source provides plating solution or electrolyte via a valve to the conduit. The plating solution may be virgin makeup solution (VMS). For a discussion of one implementation for dosing with VMS and DI water, see, e.g., U.S. patent application Ser. No. 11/590,413, filed Oct. 30, 2006, and naming Buckalew et al. as inventors, which is incorporated herein by reference in its entirety. A pump may have an input in fluid communication with the conduit. An output of the pump may communicate with an input of a filter (not shown) via a conduit. In many embodiments, this filter may be unnecessary as all the filtering is handled by a filter.

A conduit may connect to other conduits, which are connected to the anode chambers. A drain valve may be used to drain fluid from the conduit. As can be appreciated, the drain valve may be positioned at other locations in the electroplating system. For example, it may be incorporated into a variant of valve, which variant is a three-way valve. Conduits may receive electrolyte from the corresponding anode chambers. A conduit may connect additional conduits to a pressure regulating device.

The pressure regulating device may include a housing including an inlet arranged on or near a bottom surface thereof. The inlet may communicate with a vertical tubular member, which includes another inlet and an outlet. The housing further includes a first outlet that is spaced from the inlet on or near the bottom surface of the housing. The housing further includes a second outlet near an upper portion of the housing.

In various embodiments, the pressure regulating device may be exposed to atmospheric pressure such that it may be "open" and thereby may create an open loop for anolyte recirculation. Exposure to atmospheric pressure may be accomplished by, for example, providing vent holes or other openings in housing. In other cases, an electrolyte outlet pipe may have an opening to allow atmospheric contact with the electrolyte. In a specific embodiment, the outlet conduit delivers electrolyte into a trough, which may be exposed to atmospheric pressure. Additional details of a pressure regulating device suitable for some implementations is described in U.S. patent application Ser. No. 13/051,822, filed on Mar. 18, 2011, which is incorporated herein by reference in its entirety.

In the depicted embodiment, the pressure regulating device may further include a filter medium. The filter medium may include porous material that filters bubbles from the electrolyte. The filter medium may be positioned in a horizontal position as shown or in any other suitable position to filter bubbles and/or particles from the anode electrolyte before the anode electrolyte returns to the anode chambers. More generally, other forms of bubble separation devices may be employed. These include thin sheets of porous material such as "Porex"™ brand filtration products (Porex Technologies, Fairburn, Ga.), meshes, activated carbon, etc.

In some implementations, the filter medium may be arranged outside of the housing in line with a conduit. In other implementations, the filter medium may be arranged at an angle between horizontal and vertical. In still other implementations, the filter medium may be arranged in a vertical position and the outlet may be arranged on a side wall of the housing. Still other variations are contemplated.

In a specific embodiment, a filter may have a sleeve shape and may fit over a tubular member. It may fit from top to bottom over the sleeve or over at least a substantial fraction of the height. In some cases, the filter includes a sealing member such as an o-ring disposed at a location on the inner circumference of the filter and mating with the tubular member. The filter is configured to remove particles and/or gas bubbles from the electrolyte before delivering the electrolyte to an outlet. For bubble management, it may be sufficient that the filter have pores sized at approximately 40 micrometers or smaller, or in some cases sized at approximately 10 micrometers or smaller. In a specific embodiment, the average pore size is between about 5 and 10 micrometers. Such filters have the additional benefit of removing very large particles. As an example, suitable filters may be obtained from Parker Hannifin Corp., filtration division, Haverhill, Mass. (e.g., a 5 micron pore size pleated polypropylene filter part number PMG050-9FV-PR). In some designs, the outer diameter of the filter will be between about 2 and 3 inches. Further, the filter size may be chosen so that some space remains between the filter and the outer housing of the pressure regulator. Such a gap can allow easier and more reliable tuning of level sensors in the pressure regulator. In some embodiments, the regulator housing and the filter are sized so that a gap of about 0.2 to 0.5 inches remains between them.

The first outlet may communicate with a conduit, which returns anode electrolyte and completes an anode electrolyte flow loop. Another conduit connects the second outlet to the plating bath reservoir to handle overflow of anode electrolyte as needed. In some cases, as indicated above, the conduit empties into a trough prior to reaching a tank for holding the reservoir.

In some embodiments, the inlet of the vertical tubular member is vertically located below at least a portion of the membranes. The outlet of the vertical tubular member is located above the membranes.

In certain embodiments, the plating bath reservoir may provide catholyte to the cathode chambers. Because the electrolyte provided to the reservoir from the pressure regulator is anolyte, which may be without plating additives, the composition of electrolyte in the plating bath reservoir may require adjustment prior to delivering to the cathode or plating solution chambers. For example, some plating additives may be dosed into the plating bath in while held in the reservoir.

According to some embodiments, the anode chambers may be initially filled with plating solution and/or deionized water. The pump may be turned on to provide flow. In some implementations, the pump may provide approximately about 2 to about 4 L/min. The pump may cause variations in the pressure of the electrolyte in the anode chambers. Additionally, delivery of fresh plating solution from the source may introduce transient increases in the anolyte pressure within the chambers. As the pressure in the anode chamber increases, electrolyte flows out of the vertical tubular member and down an outer surface of the vertical tubular member. The electrolyte then flows through an optional filter medium and out through an outlet.

A pressure regulating device may regulate pressure in the anode chamber and may tend to prevent damage to the membrane. The system can be run using an open loop approach and without high cost pressure sensors and pumps.

In certain embodiments, the system may be designed and operated such that the anolyte pressure within an anode chamber is maintained between about 0 and about 1 psig. In some embodiments, the anolyte pressure may be between about 0.5 and about 1.0 psig, or about 0.8 psig. The pressure in the anode chamber may be the sum of the pressure head in the pressure regulating device and the pressure introduced by the pump. In some embodiments, the pressure head in device may be about 0.1 to about 0.5 psig, or about 0.3 psig.

Electrodeposition, including substrate immersion, and other methods disclosed herein can be performed in components that form a larger electrodeposition apparatus. Example apparatuses include the SABRE® IRISCell™, SABRE® NeXT Cell, SABRE® Extreme Cell, and all other SABRE® electroplating cells available from Lam Research Corp. FIG. 8 shows a schematic of a top view of an example electrodeposition apparatus. The electrodeposition apparatus 1300 can include three separate electroplating modules 1302, 1304, and 1306. The electrodeposition apparatus 1300 can also include three separate modules 1312, 1314, and 1316 configured for various process operations. For example, in some embodiments, one or more of modules 1312, 1314, and 1316 may be a spin rinse drying (SRD) module. In other embodiments, one or more of the modules 1312, 1314, and 1316 may be post-electrofill modules (PEMs), each configured to perform a function, such as edge bevel removal, backside etching, and acid cleaning of substrates after they have been processed by one of the electroplating modules 1302, 1304, and 1306.

The electrodeposition apparatus 1300 includes a central electrodeposition chamber 1324. The central electrodeposition chamber 1324 is a chamber that holds the chemical solution used as the electroplating solution in the electroplating modules 1302, 1304, and 1306. The electrodeposition apparatus 1300 also includes a dosing system 1326 that may store and deliver additives for the electroplating solution. A chemical dilution module 1322 may store and mix chemicals to be used as an etchant. A filtration and pumping unit 1328 may filter the electroplating solution for the central electrodeposition chamber 1324 and pump it to the electroplating modules.

A system controller 1330 provides electronic and interface controls to operate the electrodeposition apparatus 1300. The system controller 1330 (which may include one or more physical or logical controllers) controls some or all of the properties of the electroplating apparatus 1300. The system controller 1330 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1330 or they may be provided over a network. In certain embodiments, the system controller 1330 executes system control software.

The system control software in the electrodeposition apparatus 1300 may include instructions for controlling the timing, mixture of electrolyte components, inlet pressure, plating cell pressure, plating cell temperature, substrate temperature, current and potential applied to the substrate and any other electrodes, substrate position, substrate rotation, and other parameters of a particular process performed by the electrodeposition apparatus 1300. Specifically, the system control logic may also include instructions for immersing the substrate and applying current tailored to provide substantially uniform current density on the face of the substrate during the entire immersion process. The control logic may also provide instructions for pulsing current to the substrate during and/or after immersion. System control logic may be configured in any suitable way. For example, various process tool component sub-routines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an electroplating process may include one or more instructions for execution by the system controller 1330. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

The control logic may be divided into various components such as programs or sections of programs in some embodiments. Examples of logic components for this purpose include a substrate positioning component, an electrolyte composition control component, a pressure control component, a heater control component, and a potential/current power supply control component.

In some embodiments, there may be a user interface associated with the system controller 1330. The user interface may include a display screen, graphical software displays of the apparatus and/or process conditions, and user input devices such as pointing devices, keyboards, touch screens, microphones, etc.

In some embodiments, parameters adjusted by the system controller 1330 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1330 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment, the instructions can include inserting the substrate in a wafer holder, tilting the substrate, applying cathodic current to the substrate during immersion to provide substantially constant current density during immersion, and electrodepositing a copper containing structure on a substrate.

A hand-off tool 1340 may select a substrate from a substrate cassette such as the cassette 1342 or the cassette 1344. The cassettes 1342 or 1344 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1340 may hold the substrate using a vacuum attachment or some other attaching mechanism.

The hand-off tool 1340 may interface with a wafer handling station 1332, the cassettes 1342 or 1344, a transfer station 1350, or an aligner 1348. From the transfer station 1350, a hand-off tool 1346 may gain access to the substrate. The transfer station 1350 may be a slot or a position from and to which hand-off tools 1340 and 1346 may pass substrates without going through the aligner 1348. In some embodiments, however, to ensure that a substrate is properly aligned on the hand-off tool 1346 for precision delivery to an electroplating module, the hand-off tool 1346 may align the substrate with an aligner 1348. The hand-off tool 1346 may also deliver a substrate to one of the electroplating modules 1302, 1304, or 1306 or to one of the three separate modules 1312, 1314, and 1316 configured for various process operations.

An example of a process operation according to the methods described above may proceed as follows: (1) electrodeposit copper onto a substrate to form a copper containing structure in the electroplating module 1304; (2) rinse and dry the substrate in SRD in module 1312; and, (3) perform edge bevel removal in module 1314.

An apparatus configured to allow efficient cycling of substrates through sequential plating, rinsing, drying, and PEM process operations may be useful for implementations for use in a manufacturing environment. To accomplish this, the module 1312 can be configured as a spin rinse dryer and an edge bevel removal chamber. With such a module 1312, the substrate would only need to be transported between the electroplating module 1304 and the module 1312 for the copper plating and EBR operations.

Figure 14:
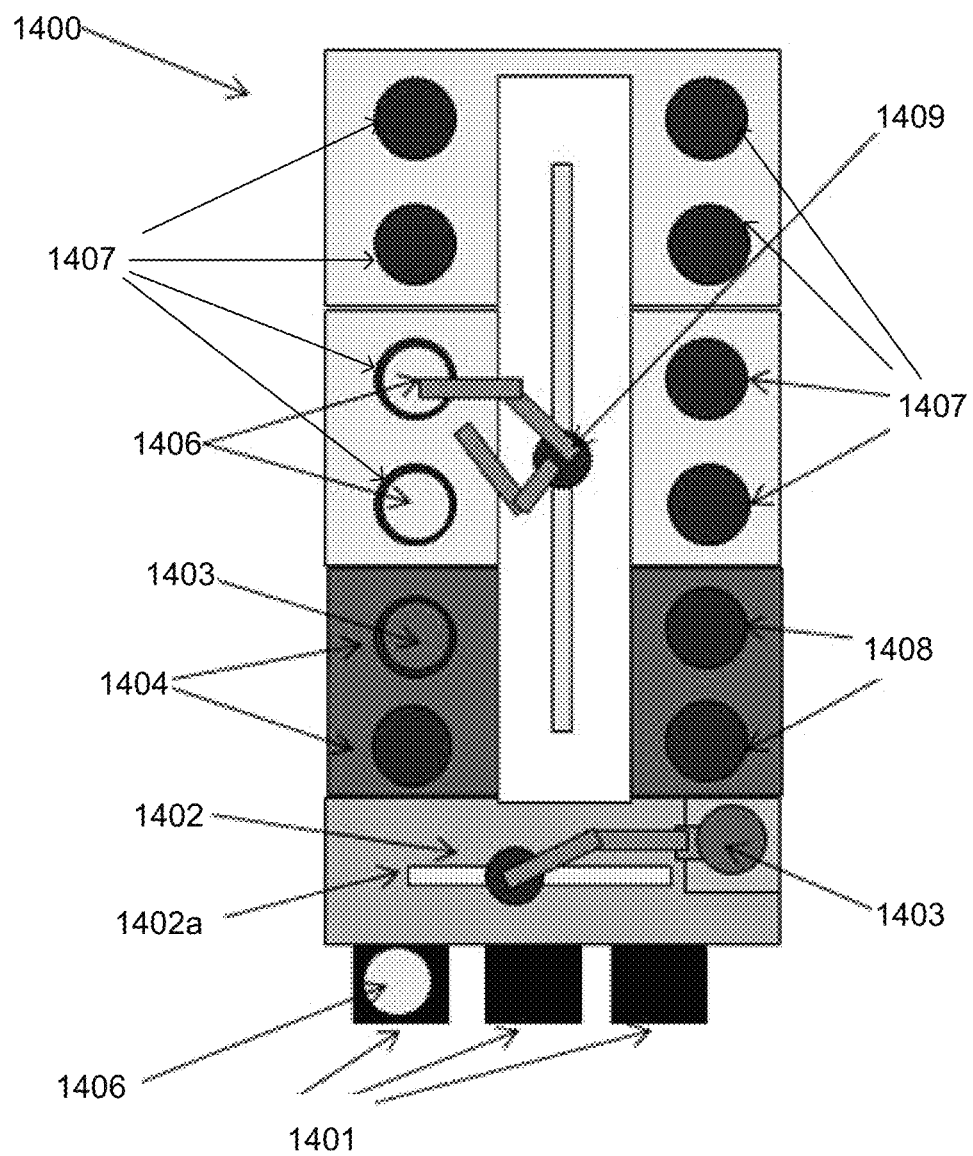
FIG. 14 is a schematic illustration of an electroplating apparatus that may be used for practicing various embodiments.

An alternative embodiment of an electrodeposition apparatus 1400 is schematically illustrated in FIG. 14. In this embodiment, the electrodeposition apparatus 1400 has a set of electroplating cells 1407, each containing an electroplating bath, in a paired or multiple "duet" configuration. In addition to electroplating per se, the electrodeposition apparatus 1400 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1400 is shown schematically looking top down in FIG. 14, and only a single level or "floor" is revealed in the figure, but it is to be readily understood by one having ordinary skill in the art that such an apparatus, e.g. the SABRE® 3D tool from Lam Research Corp., can have two or more levels "stacked" on top of each other, each potentially having identical or different types of processing stations.

Referring once again to FIG. 14, the substrates 1406 that are to be electroplated are generally fed to the electrodeposition apparatus 1400 through a front end loading FOUP 1401 and, in this example, are brought from the FOUP to the main substrate processing area of the electrodeposition apparatus 1400 via a front-end robot 1402 that can retract and move a substrate 1406 driven by a spindle 1403 in multiple dimensions from one station to another of the accessible stations—two front-end accessible stations 1404 and also two front-end accessible stations 1408 are shown in this example. The front-end accessible stations 1404 and 1408 may include, for example, pre-treatment stations, and spin rinse drying (SRD) stations. Lateral movement from side-to-side of the front-end robot 1402 is accomplished utilizing robot track 1402a. Each of the substrates 1406 may be held by a cup/cone assembly (not shown) driven by a spindle 1403 connected to a motor (not shown), and the motor may be attached to a mounting bracket 1409. Also shown in this example are the four "duets" of electroplating cells 1407, for a total of eight electroplating cells 1407. The electroplating cells 1407 may be used for electroplating copper for the copper containing structure and electroplating solder material for the solder structure. A system controller (not shown) may be coupled to the electrodeposition apparatus 1400 to control some or all of the properties of the electrodeposition apparatus 1400. The system controller may be programmed or other configured to execute instructions according to processes described earlier herein.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A plating cell for electroplating a substantially defect-free and uniform layer of a metal onto a wafer, the plating cell comprising:
   a wafer holder configured to hold a semiconductor wafer during electroplating and immerse the wafer in plating solution;
   an inlet for receiving the plating solution flowing through the plating cell during electroplating;
   an outlet for removing the flowing plating solution during electroplating; and
   a chamber wall comprising
      a primary weir on the top surface of the chamber wall over which the plating solution overflows before exiting the outlet during electroplating, and
      a secondary weir positioned at a region below the primary weir where the overflowed plating solution can pool and remain in contact with the plating solution overflowing the primary weir,
   whereby during operation the plating solution flows over the primary weir in a substantially azimuthally uniform manner.

2. The plating cell of claim 1, wherein the secondary weir and the primary weir are each part of a monolithic structure.

3. The plating cell of claim 1, wherein a distance between a top of the secondary weir and a top of the primary weir is less than 10 millimeters.

4. The plating cell of claim 1, wherein a distance between a top of the secondary weir and a top of the primary weir is between about 1 and about 4 millimeters.

5. The plating cell of claim 1, wherein the secondary weir and the primary weir are not part of the same monolithic structure.

6. The plating cell of claim 5, wherein the secondary weir comprises elastomer.

7. The plating cell of claim 1, wherein the secondary weir defines a moat measuring between about 1 millimeter and about 3 millimeters from top to bottom.

8. The plating cell of claim 7, wherein the moat is partially defined by the chamber wall.

9. The plating cell of claim 7, wherein a first slope connects the primary weir to the moat and a second slope connects the moat to the secondary weir.

10. The plating cell of claim 9, wherein a base of the moat is horizontal in shape.

11. The plating cell of claim 9, wherein a base of the moat is curved in shape.

12. The plating cell of claim 1, further comprising a controller configured to control plating solution flow rate in the plating cell such that the flow rate is increased between electroplating the wafer and electroplating a subsequent wafer.

13. The plating cell of claim 1, further comprising a region for supporting anode during electroplating.

14. The plating cell of claim 13, further comprising a cathode region, wherein the region for supporting anode is a separated anode chamber.

15. The plating cell of claim 1, wherein the secondary weir prevents formation of dry areas on any azimuthal position of the primary weir.

16. The plating cell of claim 1, wherein the chamber wall further comprises an inner slanted component angled downwards from a horizontal component of a top surface of the chamber wall towards the center of the chamber.

17. A method of electroplating layers of metal on wafers in a plating cell, the method comprising:
flowing plating solution to a plating cell at a first flow rate while electroplating a first semiconductor wafer with the plating solution;
removing the first semiconductor wafer from the plating solution;
increasing plating solution flow to a second flow rate after electroplating the first semiconductor wafer,
wherein the plating solution flows over a primary weir to a secondary weir positioned at a region below the primary weir where overflowed plating solution pools and remains in contact with the plating solution overflowing the primary weir, whereby overflow of the plating solution over the primary weir is substantially azimuthally uniform;
decreasing the flow rate of the plating solution to about the first flow rate; and
electroplating a second semiconductor wafer while contacting the second semiconductor wafer with the flowing plating solution.

18. The method of claim 17, further comprising prior to flowing plating solution,
tilting the second semiconductor wafer towards an entry point on the second semiconductor wafer, and
tilting the plating cell at an angle greater than 0.05° and less than about 0.15° towards the entry point on the second semiconductor wafer.

19. The method of claim 17, wherein the first flow rate is between about 2 L/min and about 20 L/min.

20. The method of claim 17, wherein the plating solution is flowed at the second flow rate for about 20 seconds.

21. The method of claim 17, wherein the second flow rate is about 1.2 to about 5 times greater than the first flow rate.

22. The method of claim 17, wherein the secondary weir and the primary weir are each part of a monolithic structure.

* * * * *